(12) United States Patent
Ahn et al.

(10) Patent No.: US 9,006,081 B2
(45) Date of Patent: Apr. 14, 2015

(54) METHODS OF PROCESSING SUBSTRATES

(75) Inventors: Jung-Seok Ahn, Seoul (KR); Il Hwan Kim, Hwaseong-si (KR); Jung-Hwan Kim, Bucheon-si (KR); Sangwook Park, Hwaseong-si (KR); Chungsun Lee, Anyang-si (KR); Kwang-chul Choi, Suwon-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 228 days.

(21) Appl. No.: 13/530,543

(22) Filed: Jun. 22, 2012

(65) Prior Publication Data

US 2012/0329249 A1    Dec. 27, 2012

(30) Foreign Application Priority Data

Jun. 22, 2011    (KR) .................. 10-2011-0060782

(51) Int. Cl.
*H01L 21/00*    (2006.01)
*H01L 21/78*    (2006.01)

(52) U.S. Cl.
CPC ........................... *H01L 21/78* (2013.01)

(58) Field of Classification Search
CPC ................. H01L 21/6836; H01L 2221/68318; H01L 2221/68327

USPC .......................... 438/455, 458–459
See application file for complete search history.

(56) References Cited

U.S. PATENT DOCUMENTS 7,867,876 B2 *   1/2011   Codding et al. .............. 438/458

FOREIGN PATENT DOCUMENTS

| | | |
|---|---|---|
| JP | 2010-153812 | 7/2010 |
| JP | 2010-278235 | 12/2010 |
| JP | 2010-287660 | 12/2010 |
| KR | 10-2010-0073984 A | 7/2010 |

* cited by examiner

*Primary Examiner* — Laura Menz
(74) *Attorney, Agent, or Firm* — Muir Patent Consulting, PLLC

(57) ABSTRACT

Methods of manufacturing a plurality of semiconductor chips are provided. The method may include providing a middle layer between a substrate and a carrier to combine the carrier with the substrate, thinning the substrate; after thinning the substrate, separating the carrier from the substrate; and after the carrier is separated from the substrate, cutting the substrate to form the plurality of semiconductor chips, wherein the middle layer is adhered to the carrier with a first bonding force, and the middle layer is adhered to the substrate with a second bonding force, and wherein the second bonding force is greater than the first bonding force.

8 Claims, 23 Drawing Sheets

METHODS OF PROCESSING SUBSTRATES

CROSS-REFERENCE TO RELATED APPLICATIONS

This U.S. non-provisional patent application claims priority under 35 U.S.C. §119 to Korean Patent Application No. 10-2011-0060782, filed on Jun. 22, 2011, the entirety of which is incorporated by reference herein.

BACKGROUND

The present disclosure relates to methods of processing substrates and, more particularly, to methods of processing substrates for thinning the substrates.

SUMMARY

Embodiments of the disclosure are directed to methods of processing substrates.

In one embodiment, a method of manufacturing at least a first semiconductor chip comprises the steps of: providing a middle layer between a substrate and a carrier to combine the carrier with the substrate; thinning the substrate; and after thinning the substrate, separating the carrier from the substrate; and after the carrier is separated from the substrate, cutting the substrate to form at least the first semiconductor chip, wherein the middle layer is adhered to the carrier with a first bonding force, and the middle layer is adhered to the substrate with a second bonding force, and wherein the second bonding force is greater than the first bonding force.

In one embodiment, a method of manufacturing a plurality of semiconductor chips comprises the steps of: providing a wafer with a first surface and a second surface opposite to the first surface, an integrated circuit formed on the first surface of the wafer, an adhesion layer having a first surface adhered to the second surface of the wafer, a release layer adhered to a second surface of the adhesion layer, the second surface of the adhesion layer opposite the first surface of the adhesion layer, and a first surface of a carrier adhered to the release layer; mechanically separating the carrier from the adhesion layer without the use of a laser; after separating the carrier from the adhesion layer, removing the adhesion layer from the wafer; and after removing the adhesion layer from the wafer, cutting the wafer to form a plurality of semiconductor chips.

In one embodiment, a method of manufacturing a plurality of semiconductor chips comprises the steps of: providing a semiconductor device including a semiconductor substrate, the semiconductor substrate having a first surface and a second surface opposite to the first surface, an adhesive layer having a first surface attached to the second surface of the semiconductor substrate, a separation layer attached to a second surface of the adhesive layer, the second surface of the adhesive layer opposite the first surface of the adhesive layer, and a semiconductor support attached to the separation layer; removing a portion of the semiconductor device; after removing the portion of the semiconductor device, mechanically separating the semiconductor support from the adhesive layer; after separating the semiconductor support from the adhesive layer, removing the adhesive layer from the semiconductor substrate; and cutting the semiconductor substrate to form the plurality of semiconductor chips, wherein the separation layer comprises one or more of silicon oil and polyethylene, and the semiconductor support comprises a material that forms covalent bonds with the separation layer.

BRIEF DESCRIPTION OF THE DRAWINGS

The above and other aspects and features of the disclosure will become apparent by describing in detail exemplary embodiments thereof with reference to the attached drawings, in which.

DETAILED DESCRIPTION OF THE EMBODIMENTS

Figure 1A:
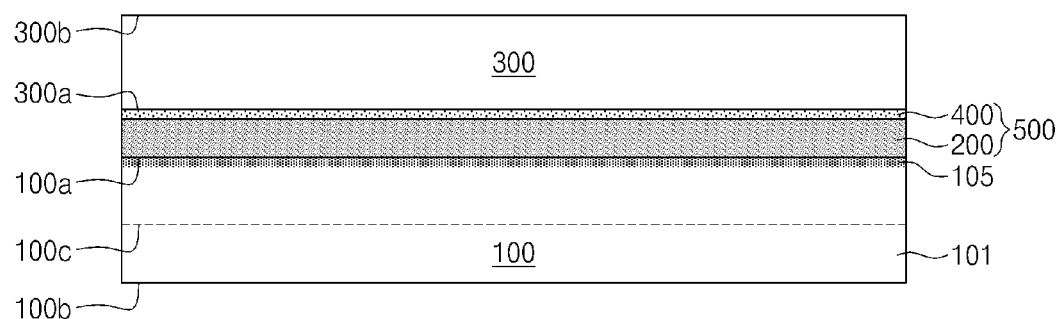
FIG. 1A is a cross sectional view illustrating a temporary bonding structure of a wafer and a carrier according to example embodiments.

Various example embodiments will now be described more fully hereinafter with reference to the accompanying drawings, in which exemplary embodiments are shown. The present invention may, however, be embodied in many different forms and should not be construed as limited to the example embodiments set forth herein. That is, these example embodiments are just that—examples—and many implementations and variations are possible that do not require the various details herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein.

The language of the claims should be referenced in determining the requirements of the invention. In the drawings, the sizes and relative size of layers and regions may be exaggerated for clarity. Like numerals refer to like elements throughout.

The terminology used herein is for the purpose of describing particular embodiments only and is not intended to limit the invention. As used herein, the singular terms "a," "an" and "the" should not exclude the plural forms as well, unless the context clearly indicates otherwise. As used herein, the term "and/or" includes any and all combinations of one or more of the associated listed items. It will be understood that when an element or a layer is referred to as being "on," "connected to" or "coupled to" another element or layer, it may be directly on, connected to, or coupled to the other element or layer or intervening elements or layers may be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "between" versus "directly between;" "adjacent" versus "directly adjacent," etc.).

It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures) of example embodiments. As such, variations from the shapes of the illustrations as a result, for example, of manufacturing techniques and/or tolerances, are to be expected. Example embodiments should not be construed as limited to those shown in the views, but include modifications in configuration formed on the basis of, for example, manufacturing processes. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures may be schematic in nature and their shapes are not intended to limit the scope of the present disclosure.

It will be also understood that although the terms first, second, third etc. may be used herein to describe various elements, components, regions, layers and/or sections, these elements, components, regions, layers, and/or sections should not be limited by these terms. Unless otherwise indicated, these terms are only used to distinguish one element, component, region, layer, or section from another element, components, region, layer, or section. Thus, a first element, components, region, layer, or section in some embodiments could be termed a second element, components, region, layer, or section in other embodiments, and, similarly, a second element, components, region, layer, or section could be termed a first element, components, region, layer, or section without departing from the teachings of the disclosure. Exemplary embodiments explained and illustrated herein may include their complementary counterparts.

Locational terms, such as "beneath," "below," "lower," "above," "upper" and the like, may be used herein for ease of description to describe one element or feature's relationship to another element(s) or feature(s) as illustrated in the figures. It will be understood that the locational terms may be relative to a device and are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the locational descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application and will not be interpreted in an idealized or overly formal sense unless expressly so defined herein.

Hereinafter, example embodiments will be explained in detail with reference to the accompanying drawings.

In a field of semiconductor processes, a carrier for supporting a wafer may generally adhere to the wafer using an adhesive when a thickness of the wafer is thinned by a back lap process. A laser may be irradiated to the adhesive for separating the wafer from the carrier. In this case, the wafer may be damaged by the laser irradiation. Accordingly, processes capable of more easily attaching and/or detaching the carrier without the damage of the wafer may be beneficial.

[Temporary Bonding Structure of Wafer and Carrier]

Figure 1B:
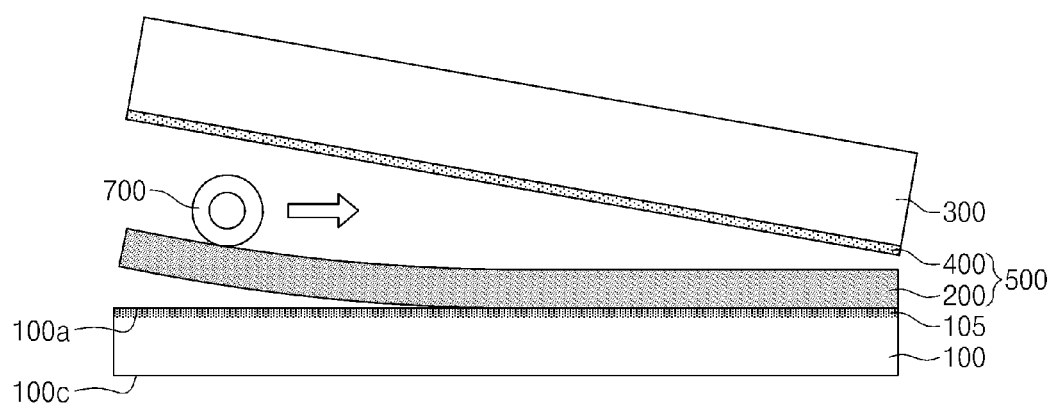
FIG. 1B is a cross sectional view illustrating an exemplary separation of a wafer and a carrier.

FIG. 1A is a cross sectional view illustrating a temporary bonding structure of a wafer and a carrier according to embodiments of the disclosure. FIG. 1B is a cross sectional view illustrating an exemplary separation of a wafer and a carrier.

Referring to FIG. 1A, a substrate 100 and a carrier 300 may be temporarily combined with each other. For example, the substrate 100 and the carrier 300 may be combined with each other, so that the substrate 100 may be supported by the carrier 300. The substrate 100 supported by the carrier 300 may be treated by a back side treatment (e.g. a back lap process) to have the substrate 100 thinned. After the back side treatment or another similar treatment (e.g. a post-FAB process) is performed, the substrate 100 and the carrier 300 may be separated from each other.

A middle layer 500 may be provided between the substrate 100 and the carrier 300 to combine (e.g. attach or adhere) the substrate 100 and the carrier 300 with each other. The substrate 100 may be a semiconductor substrate (e.g. a silicon wafer or a silicon chip) that has a top surface 100a and a bottom surface 100b opposite to the top surface 100a. An integrated circuit 105 may be formed at the top surface 100a. A back side treatment such as the back lap process or a post-FAB process may be performed on the bottom surface 100b of the substrate 100, so that the substrate 100 may become thinned. A reference numeral 100c indicates a bottom surface of the substrate 100 after it has been thinned, and a reference numeral 101 indicates a portion of the substrate 100 that is removed by the thinning treatment. The carrier 300 may support the substrate 100 during the thinning treatment. Thus, it may be possible to prevent the substrate 100 from being bent or damaged. The carrier 300 may have the same shape or the same size as that of the substrate 100 or may have a shape or a size similar to that of the substrate 100. The carrier may be a material that forms covalent bonds with silicon oil or polyethylene. The carrier 300 may be a solid that possesses a non-crystalline structure that exhibits a glass transition when heated towards the liquid state. In some embodiments, the carrier 300 may be a transparent substrate (e.g. silica glass) or a non-transparent substrate (e.g. a metal or silicon wafer) that has a top surface 300*a* in contact with the middle layer 500 and a bottom surface 300*b* opposite to the top surface 300*a*. For example, the carrier 300 may be polymer glass, a silica glass, a silicon wafer, a metal alloy, and so forth.

The middle layer 500 may be divided into at least two layers 200 and 400. The middle layer 500 may include an adhesion layer 200 adjacent to the substrate 100 and a release layer 400 adjacent to the carrier 300. The adhesion layer 200 may be provided to help bond the substrate 100 and the carrier 300. The release layer 400 may be provided for easily separating the carrier 300 from adhesion layer 200 and the substrate 100. For example, the release layer 400 may include silicon oil having a weak bonding strength to many materials, and the adhesion layer 200 may include a thermosetting adhesive or an ultraviolet (UV) curable adhesive which has a strong bonding strength. The release layer 400 and adhesion layer 200 will be discussed more below.

The bonding force between the adhesion layer 200 and the substrate 100 may be greater than the bonding force between the adhesion layer 200 and the carrier 300 and/or the bonding force between the adhesion layer 200 and the release layer 400. For example, the middle layer 500 may be adhered to the carrier 300 by a lower bonding force and may be adhered to the substrate 100 by a higher bonding force. In some embodiments, the bonding force between the middle layer 500 and the carrier 300 (specifically, between the release layer 400 and the carrier 300) may be a certain percentage lower than the bonding force between the middle layer 500 and the substrate 100 (specifically between the release layer 400 and the adhesion layer 200). In some embodiments the bonding force between the middle layer 500 and the carrier 300 is within a particular range of percentages lower than the bonding force between the middle layer 500 and the substrate 100. The bonding force may be measured by methods known in the art. In some embodiments, the bonding force may be the strength of the molecular bonds between the materials of the various layers. In some embodiments, the bonding force may be the force needed to separate one layer or one material from another layer or material.

Referring to FIG. 1B, after the substrate 100 becomes thinner, the carrier 300 and the adhesion layer 200 may be separated from the substrate 100. The carrier 300 and adhesion layer 200 may be separated from the substrate 100 through a mechanical method. For example, the carrier 300 may be separated from the substrate 100 by operating a proper apparatus capable of holding an edge portion of the carrier 300. In these examples, the carrier 300 may be easily separated by the release layer 400. In addition, after the carrier 300 is separated, the adhesion layer 200 may be adhered to a rolling tape 700 horizontally moving along the top surface 100*a* of the substrate 100, so that the adhesion layer 200 may be separated from the substrate 100. According to one embodiment, the bonding force between the adhesion layer 200 and the substrate 100 may be greater than the bonding force between the adhesion layer 200 and the carrier 300, and the release layer 400 may be provided between the carrier 300 and the adhesion layer 200. Thus, the carrier 300 may be easily separated from the substrate 100.

[First Embodiment of Temporary Bonding Process of Wafer and Carrier]

FIGS. 2A through 2F are cross sectional views illustrating a temporary bonding process of a wafer and a carrier according to some embodiments. FIGS. 2G and 2H are cross sectional views illustrating a method of fabricating a semiconductor package using a temporary bonding process of a wafer and a carrier according to some embodiments.

Figure 2A:
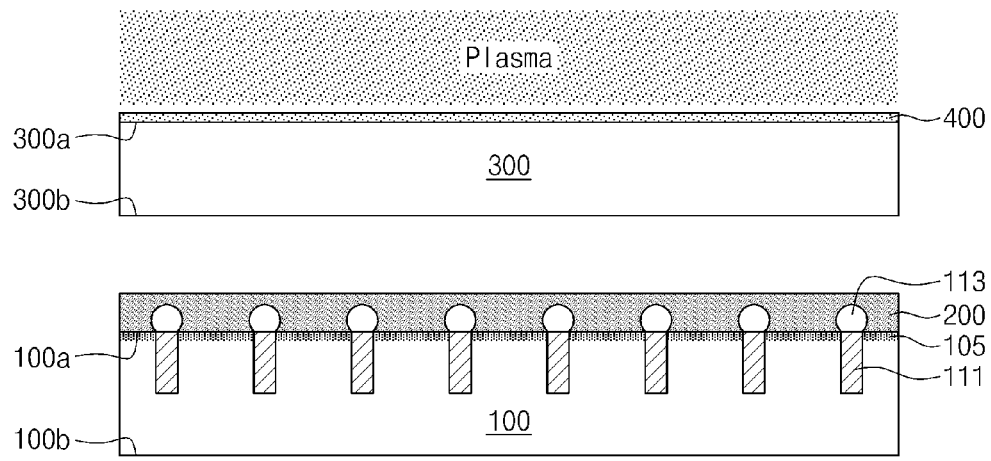
FIGS. 2A through 2F are cross sectional views illustrating a temporary bonding process of a wafer and a carrier according to some example embodiments.

Referring to FIG. 2A, a substrate 100 and a carrier 300 may be provided. The substrate 100 may be a substrate including a semiconductor material such as silicon. For example, the substrate 100 may be a silicon wafer or a silicon chip. Hereinafter, the substrate 100 is referred to as 'a wafer'. The wafer 100 may include a top surface 100*a* on which an integrated circuit 105 is formed, and a bottom surface 100*b* opposite to the top surface 100*a*. The integrated circuit 105 may be, for example, a memory circuit, a logic circuit, or combination thereof. The wafer 100 may include a plurality of through electrodes 111 which are embedded in the wafer 100. In one embodiment, the through electrodes 111 extend in a thickness direction of the wafer 100 and do not penetrate through the entire thickness of the wafer 100. The through electrodes 111 may be electrically connected to the integrated circuit 105. Connection terminals 113 (e.g. solder balls) may be disposed on the top surface 100*a* of the wafer 100 to be electrically connected to the through electrodes 111.

The term "through electrode" as used herein refers to a structure that extends through a substrate, from one surface of the substrate toward an opposite surface of the substrate. A through via may extend past one or both of the surfaces of the substrate. The term "via" may refer to one or more of the elements that form a structure that passes through the substrate (e.g., element 111 shown in FIG. 2B). The through electrodes 111 may be formed to extend from the first surface 100*a* to the second surface through back grinding the second surface 100*b* of the substrate 100 after forming a buried via in the substrate 100. In one embodiment, the through electrodes 111 may perpendicularly pass through a semiconductor chip, and may be formed to be physically and electrically connected between the semiconductor chips of a stacked chip package or between a semiconductor chip and a package substrate. The through electrode 111 may also be called a through-substrate via (TSV) and may be formed, in some embodiments, of various materials, including but not limited to silicon.

In one embodiment, the carrier 300 may be provided for supporting the wafer 100. For example, the carrier 300 may be adhered to the top surface 100*a* of the wafer 100 to support the wafer 100 during a back lap process recessing the bottom surface 100*b* of the wafer 100. Thus, it may be possible to prevent the wafer 100 from becoming bent. An adhesion layer 200 may be provided on the top surface 100*a* of the wafer 100 for firm adhesion of the carrier 300 and the wafer 100. The adhesion layer 200 may include a thermosetting adhesive which may be hardened by heat, or an UV curable adhesive which may be hardened by light such as UV. For example, the thermosetting adhesive may include at least one of epoxy, polyvinyl acetate, polyvinyl alcohol, polyvinyl acrylate, and silicon resin. The UV curable adhesive may include at least one of epoxy acrylate, urethane acrylate, polyester acrylate, silicon acrylate, and vinyl ether. The adhesion layer 200 may be formed, for example, by a chemical vapor deposition (CVD) process, a spray coating process, or a spin coating process.

The carrier 300 may include a transparent or non-transparent substrate. For example, if the adhesion layer 200 includes the UV curable adhesive, the carrier 300 may include a transparent substrate such as glass and/or polycarbonate. If the adhesion layer 200 includes the thermosetting adhesive, the carrier 300 may include the transparent substrate, or a non-transparent substrate such as a metal or silicon wafer. The carrier 300 may be a stiff substrate or a flexible substrate. For example, the carrier 300 may be a stiff substrate to firmly support the wafer 100. In one embodiment, the adhesion layer 200 may be the UV curable adhesive and the carrier 300 may be a glass substrate, but the materials of the adhesion layer 200 and carrier 300 are not limited thereto.

The carrier 300 may include a top surface 300a and a bottom surface 300b, and a release layer 400 may be disposed on the top surface 300a for easily separating the carrier 300 from the wafer 100. In some embodiments, the carrier 300 is a material to which the release layer 400 may form strong bonds. The release layer 400 may include silicon oil and/or polyethylene. The release layer 400 may be plasma-treated to increase a bonding force between the release layer 400 and the adhesion layer 200 through a plasma treatment. The plasma treatment for the release layer 400 may be performed using plasma including an argon (Ar) gas for surface reforming of the release layer 400. A plasma treatment may alter the surface chemistry of the silicon oil of the release layer 400, adding silanol (SiOH) groups to the surface of the release layer 400.

A silicon oil may be any polymerized siloxane that has organic side chains. Silicon oil may also be known as silicone oil. Silicon oils are typically formed of alternating silicon-oxygen atoms or siloxane rather than carbon atoms. A siloxane is a chemical compound that is composed of units comprising SiO and two hydrogen atoms or hydrocarbon groups (i.e. $R_2SiO$, where R is a hydrogen atom or hydrocarbon group). With a silicon oil, other species attach to the tetravalent silicon atoms, but not to the divalent oxygen atoms that are fully committed to forming the siloxane chain. In some embodiments, an example of a silicon oil may be polydimethylsiloxane, where two methyl groups attach to each silicon atom to form $(H_3C)[Si(CH_3)_2O]_nSi(CH_3)_3$. This example of silicon oil may also be referred to as dimethicone. In a silicon oil, the organic side chains may confer hydrophobic properties while the —Si—O—Si—O— backbone may be purely inorganic.

Figure 2B:
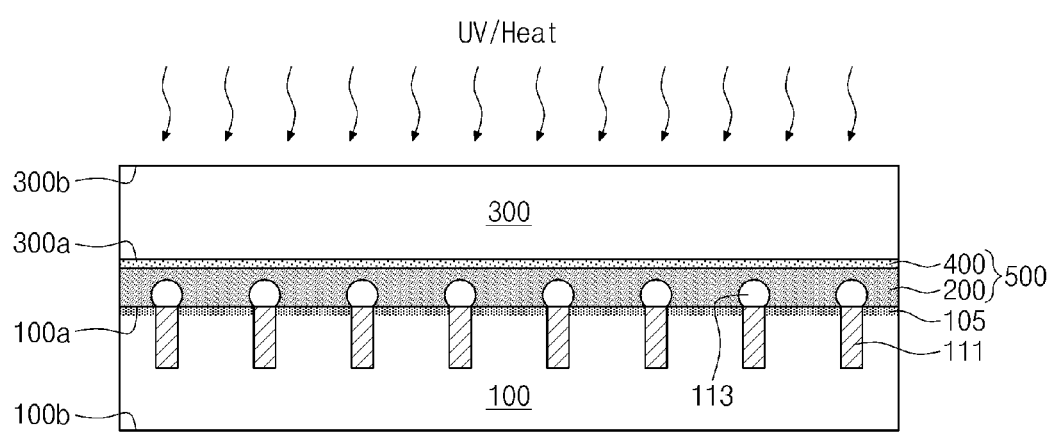

Referring to FIG. 2B, the top surface 100a of the wafer 100 and the top surface 300a of the carrier 300 may face each other to bond the carrier 300 to the wafer 100. That is, the top surface 100a of the wafer 100 may be confronted with the top surface 300a of the carrier 300 to bond the carrier 300 to the wafer 100. Thus, a structure, which includes the wafer 100, the carrier 300, and a middle layer 500 between the wafer 100 and the carrier 300, may be realized. The middle layer 500 includes the adhesion layer 200 and the release layer 400. Ultraviolet or heat may be provided to harden the adhesion layer 200, thereby firmly bonding the wafer 100 to the carrier 300. Since the release layer 400 is disposed between the carrier 300 and the adhesion layer 200, the bonding force between the adhesion layer 200 and the wafer 100 may be greater than the bonding force between the adhesion layer 200 and the carrier 300.

Figure 2C:
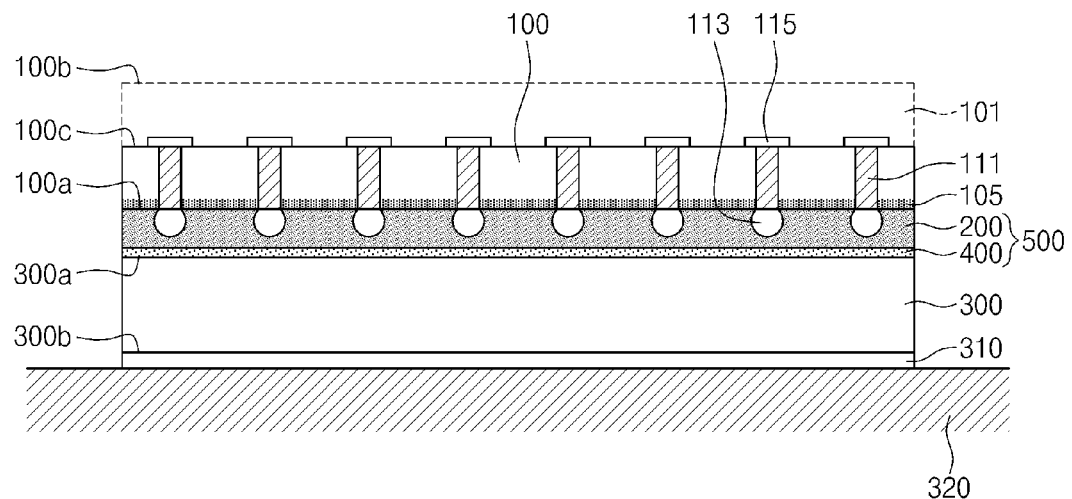

Referring to FIG. 2C, a back lap process may be performed. For example, the carrier 300 may be mounted on a chuck 320, and the bottom surface 100b of the wafer 100 may be recessed by at least one process selected from a group consisting of a chemical mechanical polishing (CMP) process, a wet etching process, a dry etching process, a spin etching process and a grinding process. The recess process may remove a portion of the wafer 100 and may be performed until at least a surface 100c, at which the through electrodes 111 are exposed. In one embodiment, the surface 100c of the wafer 100 may be referred to as a 'non-active surface 100c', and the top surface 100a of the wafer 100 may be referred to as an 'active-surface 100a'. After the back lap process is performed, a post-FAB process may further be performed. The post-FAB process may include forming pads 115 connected to the through electrodes 111 on the non-active surface 100c. Before the back lap process is performed, a protection tape 310 may be attached to the bottom surface 300b of the carrier 300 to prevent damage of the carrier 300 by contact and/or friction between the chuck 320 and the carrier 300.

Figure 2D:
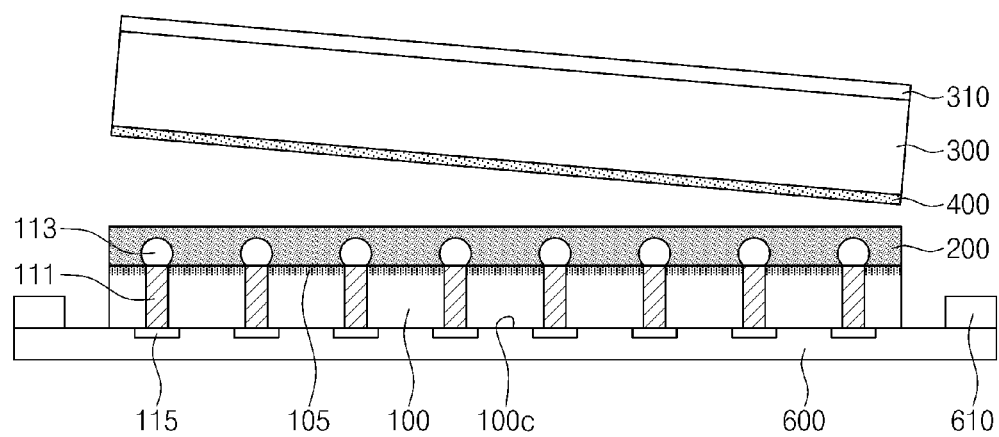

Referring to FIG. 2D, the carrier 300 may be separated from the wafer 100. The separation of the carrier 300 may be realized by a mechanical method. For example, the carrier 300 may be separated from the wafer 100 by an apparatus capable of holding an edge portion of the carrier 300. The release layer 400 may ease the separation of the carrier 300 from the wafer. For example, the silicon oil in the release layer 400 may adhere very well or very strongly to glass but may not adhere well to the adhesion layer 200. If a force is applied to pull the carrier 300 away from the wafer 100 (or the adhesion layer 200), the force may cause the carrier 300 to be removed from the wafer 100 at the level of the release layer 400. Further, silicon oil may have a high gas permeability, meaning that fewer bonds may be formed to adhere the release layer 400 to the adhesion layer 200 than the number of bonds that may form to adhere the release layer 400 to the carrier 300. For example, silicon oil may form a covalently bonded hydrophobic coating with glass (like the carrier 300), but may form a less strong bond with the materials of the adhesion layer. Thus, a laser irradiation for weakening the bonding force of the release layer 400 with the carrier 300 may not be required, and the carrier 300 may be more easily separated from the wafer 100 by applying a physical force. Accordingly, it is possible to prevent damage of the wafer 100 generated by the laser irradiation. The protection tape 310 and the carrier 300 together may be separated from the wafer 100 during the separation of the carrier 300. A protection layer 600 may be formed on the non-active surface 100c of the wafer 100. In some embodiments, the wafer 100 may be stably fixed by a holder 610. The protection layer 600 may include a tape that has elasticity and is able to expand.

Figure 2E:
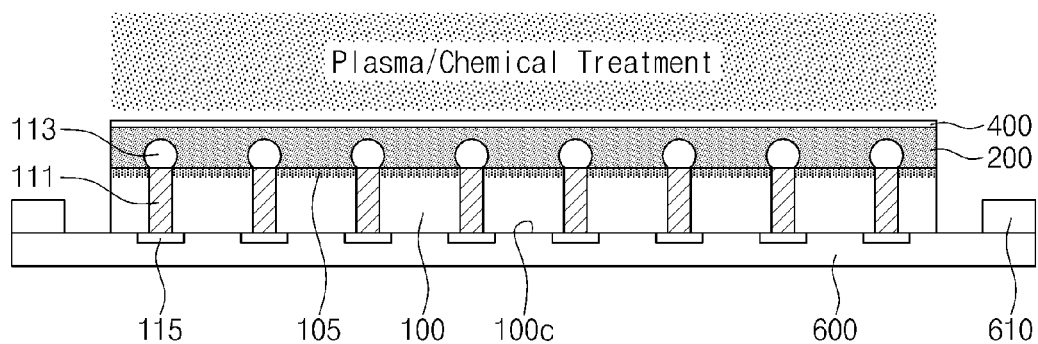

Referring to FIG. 2E, a portion of the release layer 400 may remain on the adhesion layer 200. For example, 10-15% of the release layer may remain on the adhesion layer 200. In some embodiments, up to 50% of the release layer may remain on the adhesion layer 200. The portion of the release layer 400 remaining on the adhesion layer 200 may weaken the contact force between an apparatus for separation of the adhesion layer 200 and the adhesion layer 200. As a result, it may be difficult to separate the adhesion layer 200 from the wafer 100. In some embodiments, a cleaning process such as a chemical treatment or a plasma treatment may further be performed for removal of the release layer 400. The plasma treatment may be performed using a plasma mainly including oxygen ($O_2$) and nitrogen ($N_2$). The plasma may further include fluorine (F) or a gas (e.g. $CF_4$) including fluorine. After the release layer 400 is removed, the adhesion layer 200 may then be more easily separated from the wafer 100.

Figure 2F:
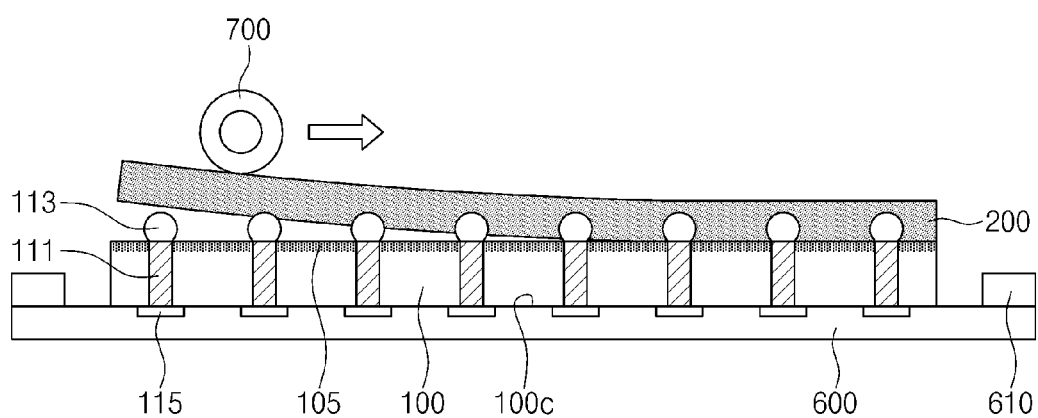
Figure 2G:
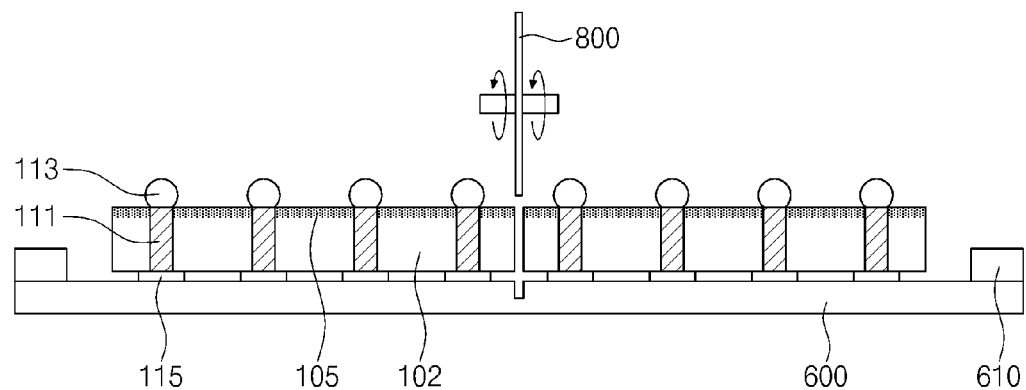
FIGS. 2G and 2H are cross sectional views illustrating a method of fabricating a semiconductor package using a temporary bonding process of a wafer and a carrier according to some example embodiments.
Figure 2H:
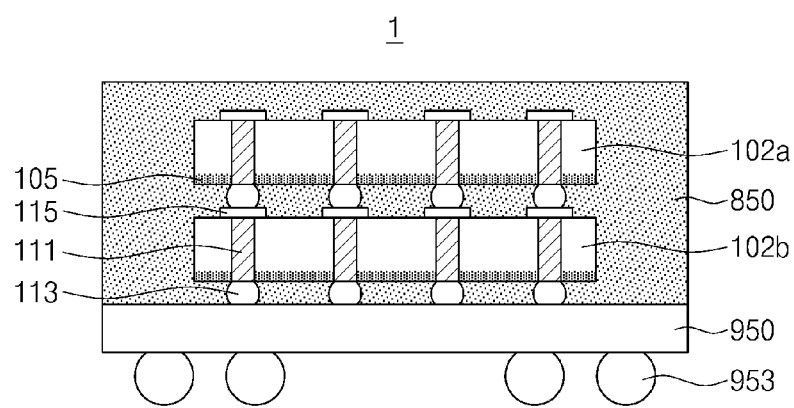

Referring to FIG. 2F, the adhesion layer 200 may be removed. For example, the adhesion layer 200 may be adhered to a rolling tape 700 that is moved along an outside surface of the adhesion layer 200 to strip the adhesion layer 200 from the wafer 100. Since the release layer 400 remaining on the adhesion layer 200 may be removed, a bonding force between the rolling tape 700 and the adhesion layer 200 is not weakened, so that the adhesion layer 200 may be more easily separated from the wafer 100. A thinned wafer 100 including the through electrodes 111 may be realized through the methods described above. The thinned wafer 100 may be packaged through processes which will be described hereinafter.

Referring to FIG. 2G, a wafer separation process may be performed. The wafer 100 may be cut along a scribe lane using a cutting wheel 800 to be divided into a plurality of chips 102. At least one selected from the plurality of chips 102 may be packaged. In some embodiments, the wafer separation process may be carried out before the adhesion layer 200 is removed. In some embodiments, the wafer separation process may be carried out before any remaining portion of the release layer 400 is removed from the adhesion layer 200.

Referring to FIG. 2H, in some embodiments, the at least one chip 102 may be mounted on a printed circuit board 950 and the at least one chip 102 may be molded to form a semiconductor package 1. For example, one or more chips 102a, 102b may be mounted on the printed circuit board 950 and then a mold layer 850 may be formed of an insulating material such as epoxy molding compound (EMC). In the semiconductor package 1, the chips 102a, 102b may be mounted in a face down state such that the integrated circuit 105 faces the printed circuit board 950. The through electrodes 111 may be used as paths of electrical signals which may be inputted and/or outputted between the printed circuit board 950 and chips 102a, 102b and/or between the chips 102a, 102b. External terminals 953 such as solder balls may be attached on a bottom surface of the printed circuit board 950.

[Second Embodiment of Temporary Bonding Process of Wafer and Carrier]

Figure 3A:
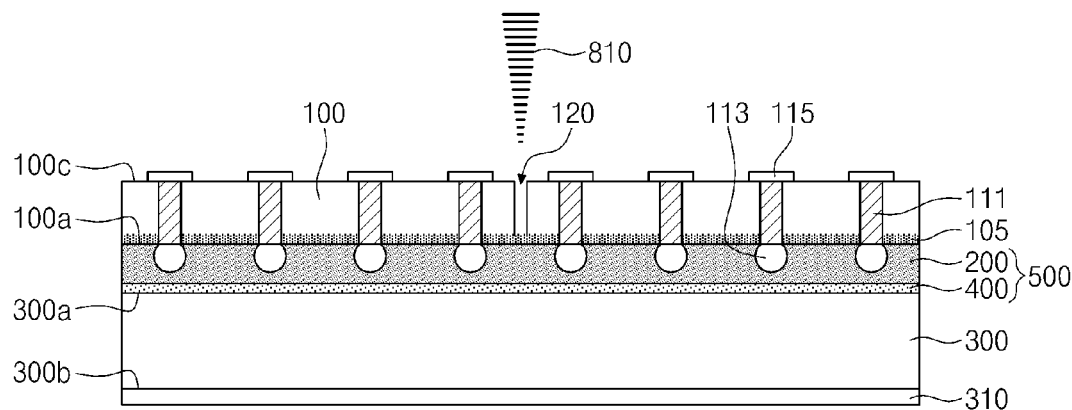
FIGS. 3A and 3B are cross sectional views illustrating a temporary bonding process of a wafer and a carrier according to example embodiments.
Figure 3B:
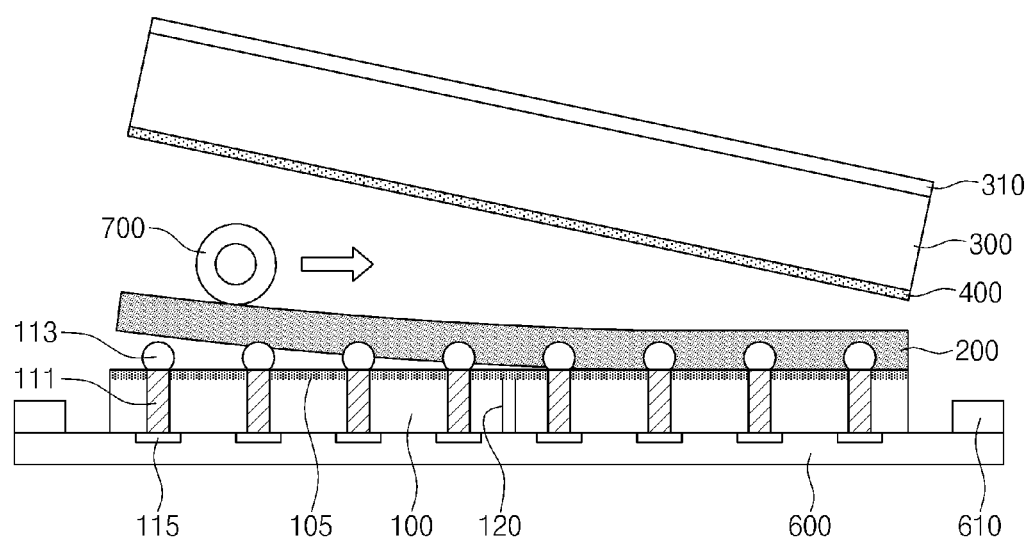
Figure 3C:
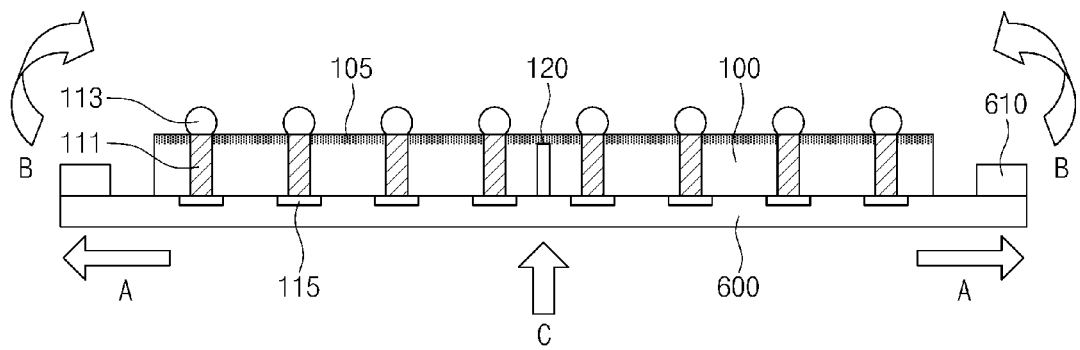
FIGS. 3C and 3D are cross sectional views illustrating a method of fabricating a semiconductor package using a temporary bonding process of a wafer and a carrier according to example embodiments.
Figure 3D:
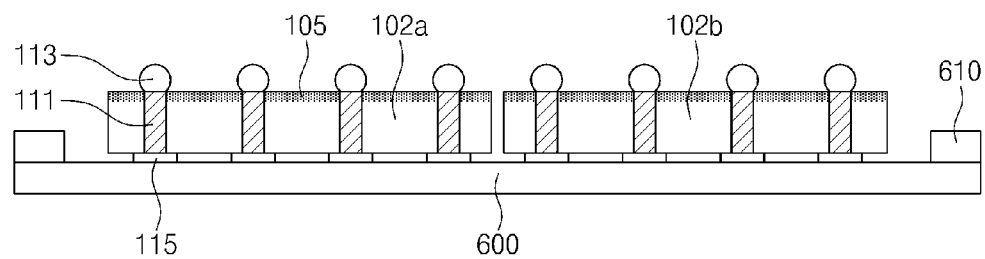

FIGS. 3A and 3B are cross sectional views illustrating a temporary bonding process of a wafer and a carrier according to some embodiments. FIGS. 3C and 3D are cross sectional views illustrating a method of fabricating a semiconductor package using a temporary bonding process of a wafer and a carrier according to some embodiments.

Referring to FIG. 3A, the wafer 100 and the carrier 300 may be bonded to each other with the middle layer 500 therebetween through processes that are the same as or similar to the processes described with reference to FIGS. 2A through 2C. The wafer 100 may then be thinned by, for example, the back side treatment. A groove 120 may be formed in the wafer 100 using a laser 810. For example, the laser 810 may be irradiated toward the non-active surface 100c of the wafer 100 to form a groove 120 extending along the scribe lane. Since the integrated circuit 105 including metal interconnections may be formed on the active surface 100a of the wafer 100, the laser 810 may not penetrate the integrated circuit 105. Accordingly, the groove 120 may not penetrate the outer thickness of the wafer 100.

Referring to FIG. 3B, the carrier 300 and the adhesion layer 200 may be separated from the wafer 100 by a mechanical method. For example, the carrier 300 and the adhesion layer 200 may be separated from the wafer 100 by a method that are the same as or similar to the method described with reference to FIGS. 2C through 2F. According to the embodiment of FIG. 3B, the thinned wafer 100, which has the through electrodes 111 and the groove 120 formed therein, may be realized. The thinned wafer 100 including the through electrodes 111 and the groove 120 may be packaged using processes which will be described hereinafter.

Referring to FIG. 3C, a physical stress may be applied to the wafer 100. A mechanical force may be applied to the wafer 100 or the protection layer 600 on the non-active surface 100c of the wafer 100 so that the portion of the wafer 100 in which the groove 120 is formed may be first separated as compare with another portion of the wafer 100. In some embodiments, as a mark A shows, a lateral stress may be applied to the wafer 100 by extending the protection layer 600 in a lateral direction. In other embodiments, as a mark B shows, the wafer 100 may be bent by laterally and upwardly extending the protection layer 600. In still other embodiments, as a mark C shows, a mechanical impact may be provided toward the non-active surface 100c of the wafer 100 in a direction substantially perpendicular to the non-active surface 100c.

Referring to FIG. 3D, the wafer 100 may be divided into a plurality of chips 102a, 102b by the physical stress applied as shown in FIG. 3C. At least one chip selected from the plurality of chips 102a, 102b may be packaged to form the semiconductor package 1 illustrated in FIG. 2H.

[First Embodiment of Method of Fabricating Semiconductor Package]

FIGS. 4A through 4I are cross sectional views illustrating an example of methods of fabricating a semiconductor package using a temporary bonding process of a wafer and a carrier according to some embodiments. FIGS. 4J through 4L are cross sectional views illustrating a modified example of methods of fabricating a semiconductor package using a temporary bonding process of a wafer and a carrier according to some embodiments.

Figure 4A:
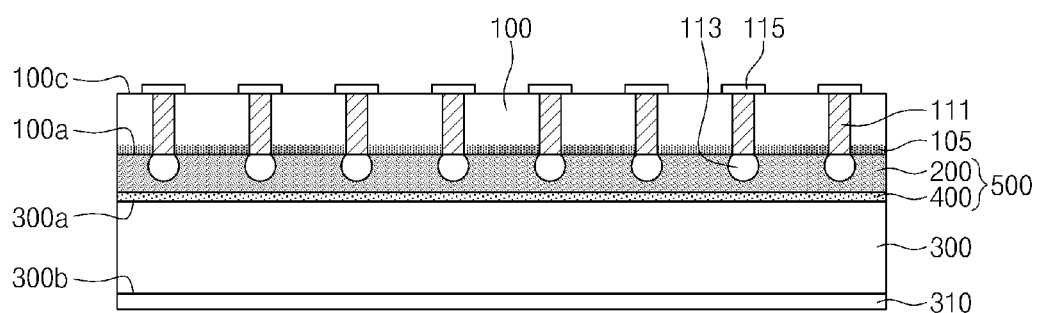
FIGS. 4A through 4I are cross sectional views illustrating an example of methods of fabricating a semiconductor package using a temporary bonding process of a wafer and a carrier according to example embodiments.

Referring to FIG. 4A, the wafer 100 and the carrier 300 may be bonded to each other with the middle layer 500 therebetween through processes that are the same as or similar to the processes described with reference to FIGS. 2A through 2C. The wafer 100 may then be thinned by, for example, the back side treatment.

Figure 4B:
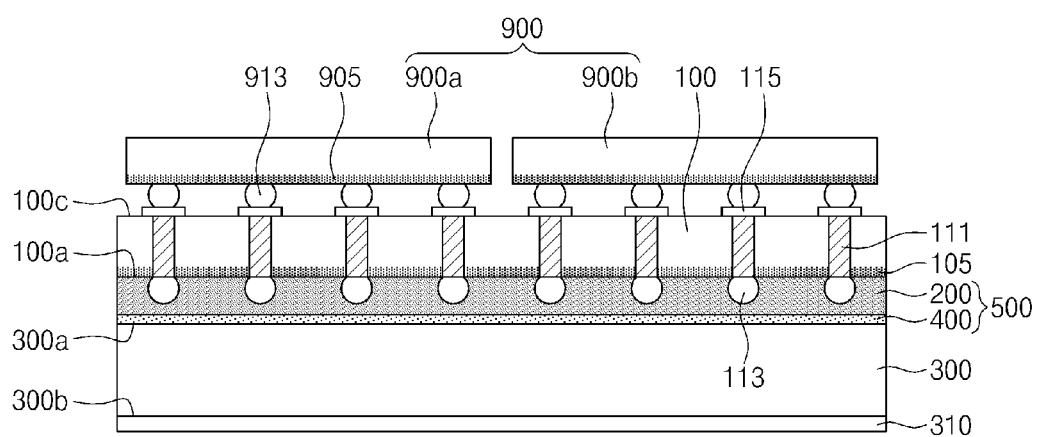

Referring to FIG. 4B, a plurality of chips 900 (e.g. chips 900a, 900b) may be stacked on the non-active surface 100c of the wafer 100. Each of the chips 900a, 900b may include an integrated circuit 905 of the same kind as or a different kind from the integrated circuit 105 formed on the wafer 100. For example, the integrated circuits 105 and 905 may be memory circuits or logic circuits. Alternatively, one of the integrated circuit 105 in the wafer 100 and the integrated circuit 905 in the chip 900 may be the logic circuit and the other may be the memory circuit. One or more of the chips 900 may be stacked on the non-active surface 100c of the wafer 100 in a face down state. The chips 900 may be electrically connected to the through electrodes 111 through connection terminals 913 such as solder balls.

Figure 4C:
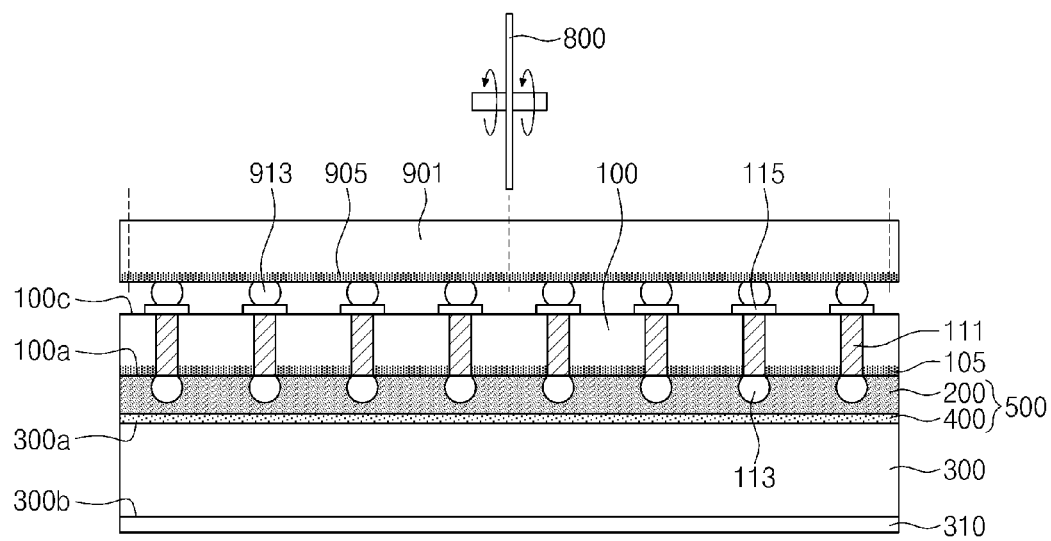

Referring to FIG. 4C, according to a modified embodiment of FIG. 4B, a second wafer 901 may be stacked on the non-active surface 100c of the wafer 100. The second wafer 901 may include an integrated circuit 905 of the same kind as or a different kind from the integrated circuit 105 formed on the wafer 100. The second wafer 901 may be stacked on the non-active surface 100c of the wafer 100 in a face down state. The second wafer 901 may be electrically connected to the through electrodes 111 through connection terminals 913 such as solder balls. The second wafer 901 may be divided into a plurality of chips 900 (e.g. 900a, 900b in FIG. 4D) by a cutting wheel 800, thereby forming a structure that are the same as or similar to the structure illustrated in FIG. 4B.

Figure 4D:
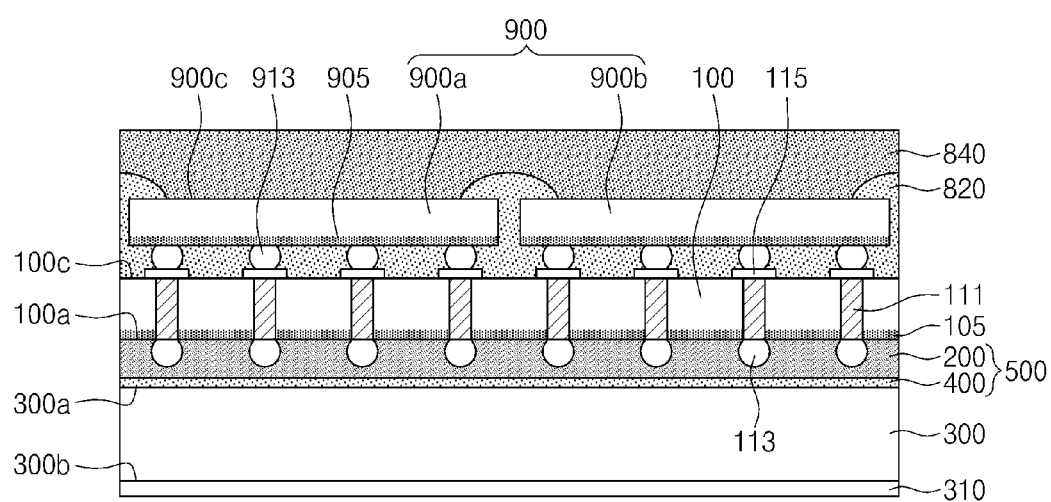

Referring to FIG. 4D, an under-fill layer 820 and a mold layer 840 may be formed. The under-fill layer 820 may be formed by providing a sufficiency of an insulating material to fill between the wafer 100 and the chips 900 (e.g. 900a, 900b) and between the chips 900 (e.g. between chips 900a and 900b). The mold layer 840 may be formed to cover the chips 900 after the under-fill layer 820 is formed. At least one of the under-fill layer 820 and the mold layer 840 may be formed of epoxy resin. In some embodiments, the formation of the under-fill layer 820 may be skipped, and the mold layer 840 may be formed to fill between the wafer 100 and the chips 900 and between the chips 900. In other embodiments, the under-fill layer 820 may be formed to cover the chips 900, and the formation of the mold layer 840 may be skipped.

Figure 4E:
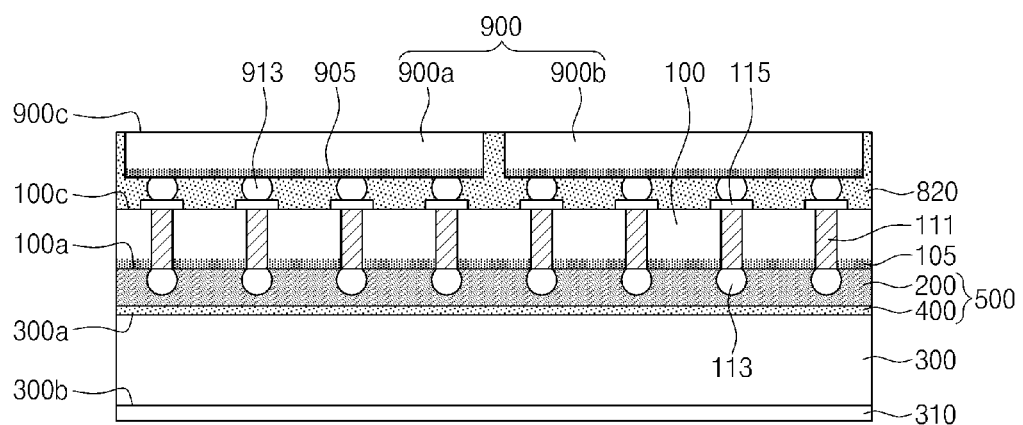

Referring to FIG. 4E, the mold layer 840 may be removed. For example, the mold layer 840 may be removed by a planarization process using a chemical mechanical polishing process. Portions of the under-fill layer 820 formed on non-active surfaces 900c of the chips 900 (e.g. chips 900a, 900b) may be removed during the planarization process of the mold layer 840. By the planarization process of the mold layer 840, the under-fill layer 820 may surround sidewalls of the chips 900 (e.g. chips 900a, 900b) and the non-active surfaces 900c of the chips 900 (e.g. chips 900a, 900b) may be exposed.

Figure 4F:
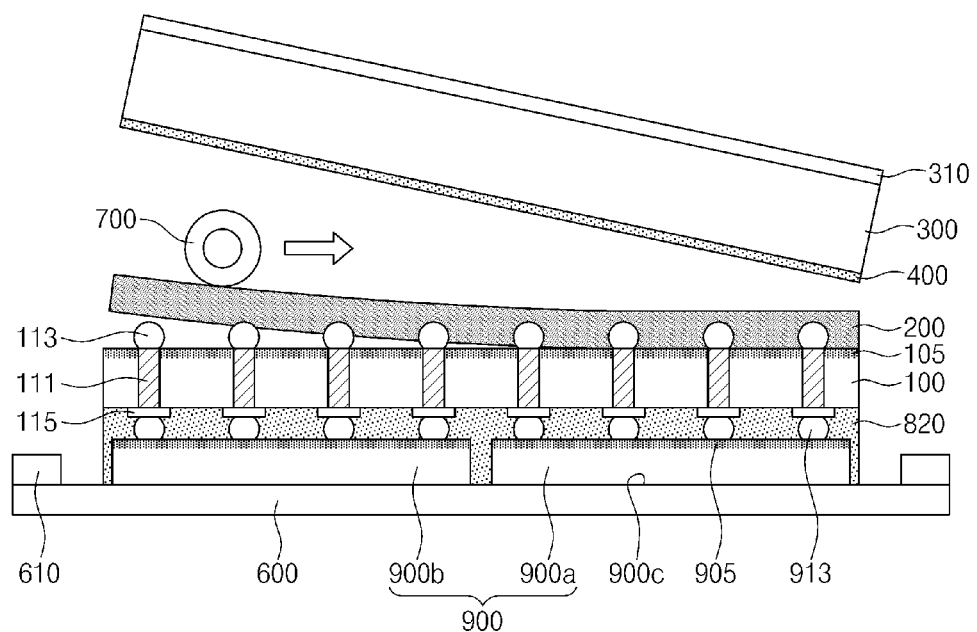

Referring to FIG. 4F, the carrier 300 and the adhesion layer 200 may be separated from the wafer 100. The carrier 300 and the adhesion layer 200 may be separated from the wafer 100 by processes that are the same as or similar to the processes described with reference to FIGS. 2D through 2F. In some embodiments, the protection layer 600 may be attached to cover the non-active surfaces 900c of the chips 900 (e.g. chips 900a, 900b), and the wafer 100 may be fixed using the holder 610. The carrier 300 may be removed from the wafer 100 using the apparatus capable of holding an edge portion of the carrier 300. The adhesion layer 200 may be adhered to the rolling tape 700, which is horizontally moved along the outer surface of the adhesion layer 200 to remove it from the wafer 100. After the carrier 300 is removed, if any portion of the release layer 400 remains on the adhesion layer 200, that portion of the release layer 400 may be removed by the chemical or plasma treatment or by other methods discussed above.

Figure 4G:
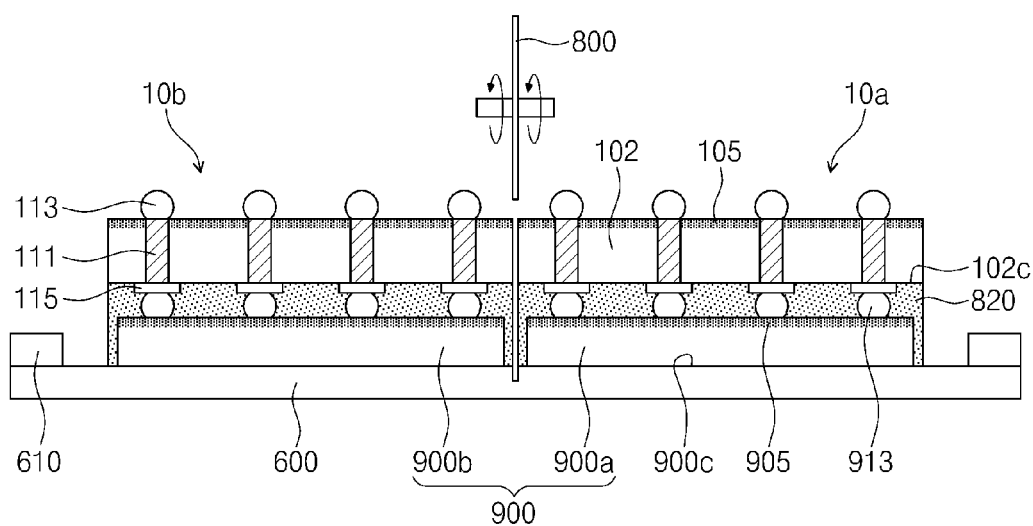

Referring to FIG. 4G, the under-fill layer 820 and the wafer 100 may be divided using the cutting wheel 800. In some embodiments, the wafer 100 and under-fill layer 820 may be divided before the adhesion layer 200 is removed from the wafer. In some embodiments, the under-fill layer 820 and the wafer 100 may be divided before the removal of a portion of the release layer 400 remaining on the adhesion layer 200 after the carrier 300 has been separated from the wafer 100. After the under-fill layer 820 and wafer 100 are divided using the cutting wheel 800, a plurality of chip stacks 10 (e.g. stacks 10a, 10b) may be realized. Each of the chip stacks 10 may include the chip 102 (hereinafter, referred to as 'a first chip) divided from the wafer 100, and the chip 900 (hereinafter, referred to as 'a second chip) bonded to a non-active surface 102c of the first chip 102 by a flip-chip bonding technique. The second chip 900 may have a smaller size than the first chip 102 or may be the same size as the first chip 102. At least one of the chip stacks 10a, 10b selected from the plurality of chip stacks 10 may be packaged.

Figure 4H:
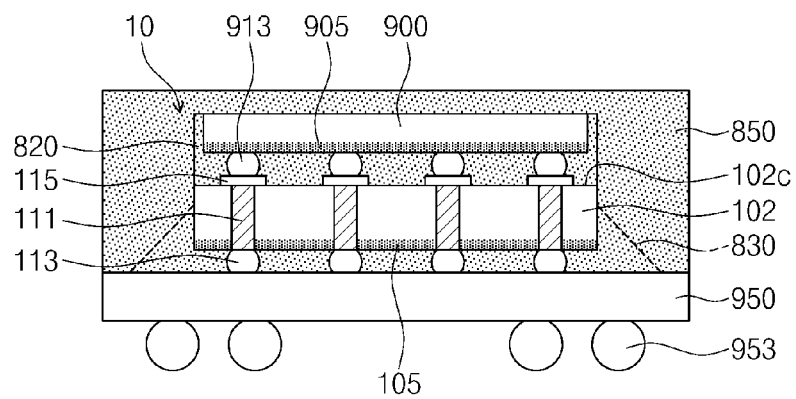

Referring to FIG. 4H, at least one chip stack 10 (e.g. 10a or 10b) may be mounted on a printed circuit board 950, and a mold layer 850 may be formed to form a semiconductor package 2. The under-fill layer 820 may be disposed between the first and second chips 102 and 900 and may surround a sidewall of the second chip 900. In some embodiments, before the mold layer 850 is formed, a second under-fill layer 830 disposed to fill the space between the first chip 102 and the printed circuit board 950 may be formed. In the semiconductor package 2, the first chip 102 may be mounted on the printed circuit board 950 in the face down state, and the second chip 900 may be stacked on the non-active surface 102c of the first chip 102 in the face down state.

Figure 4I:
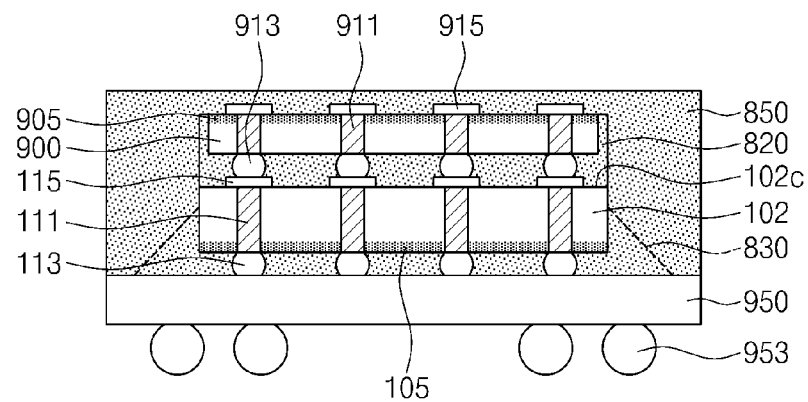
Figure 4J:
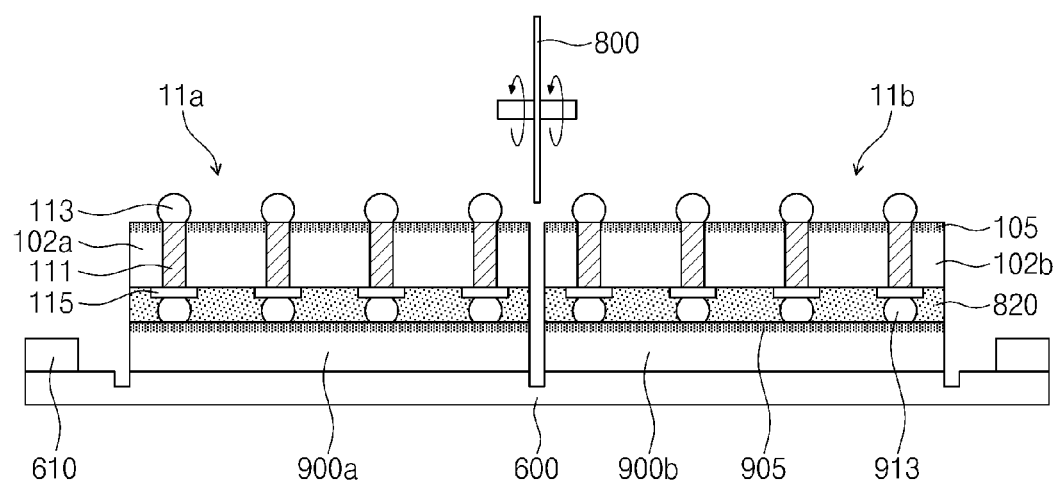
FIGS. 4J through 4L are cross sectional views illustrating a modified example of methods of fabricating a semiconductor package using a temporary bonding process of a wafer and a carrier according to example embodiments.
Figure 4K:
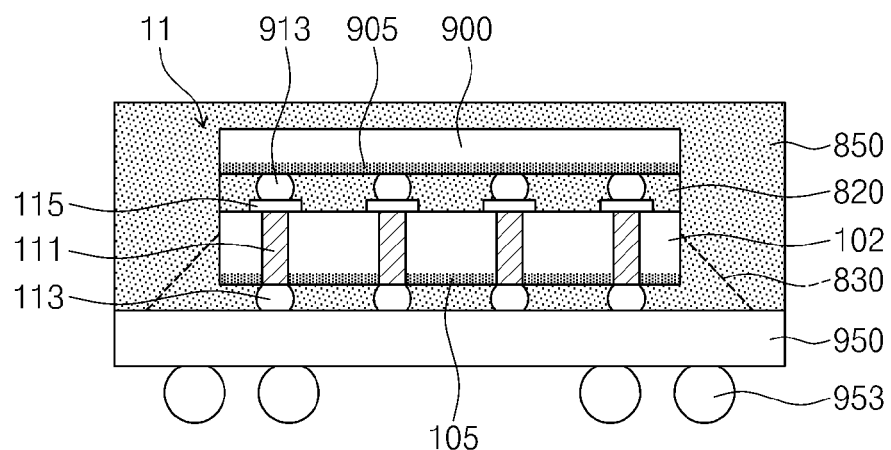
Figure 4L:
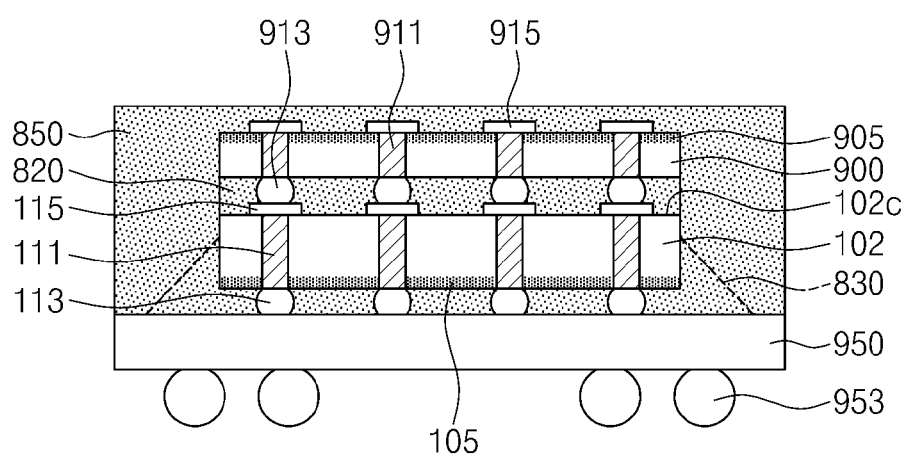

Referring to FIG. 4I, according to a modified embodiment of FIG. 4F, the second chip 900 further including through electrodes 911 may be stacked on the non-active surface 102c of the first chip 102 in the face down state, thereby forming a semiconductor package 3. For example, the second chips 900 including the through electrodes 911 may be stacked on the non-active surface 100c of the wafer 100 in the face down state in FIG. 4B, or the second wafer 901 including the through electrodes 911 may be stacked on the non-active surface 100c of the wafer 100 in the face down state in FIG. 4C. Accordingly, the semiconductor package 3 may be formed. The second chip 900 may further include pads 915 connected to the through electrodes 911, so that another chip may be stacked on the second chip 900 to be electrically connected to the second chip 900.

Referring to FIG. 4J, according to a modified embodiment of FIG. 4G, when the wafer 100 is divided using the cutting wheel 800, a size of the first chip 102 formed by dividing the wafer 100 may be the same as or similar to the size of second chip 900. Thus, the first chip 102a and the second chip 900a having the same size or similar sizes may be stacked to form a chip stack 11a. A plurality of chip stacks 11 (e.g. stacks 11a, 11b) may be obtained. At least one of the chip stacks 11 may be packaged.

Referring to FIG. 4K, at least one chip stack 11 may be mounted on the printed circuit board 950, and the mold layer 850 may be formed to form a semiconductor package 4. Since the sizes of the first and second chips 102 and 900 may be the same as each other or similar to each other, the under-fill layer 820 may be confinedly formed between the first chip 102 and the second chip 900.

Referring to FIG. 4L, according to a modified embodiment of FIG. 4K, the second chip 900 having the through electrodes 911 may be stacked on the non-active surface 102c of the first chip 102 in a face up state to form a semiconductor package 5. For example, in FIG. 4J, the second chip 900 including the through electrodes 911 may be stacked on the non-active surface 100c of the wafer 100 in the face up state, or the second wafer 901 including the through electrodes 911 may be stacked on the non-active surface 100c of the wafer 100 in the face up state.

[Second Embodiment of Method of Fabricating Semiconductor Package]

FIGS. 5A through 5I are cross sectional views illustrating another example of methods of fabricating a semiconductor package using a temporary bonding process of a wafer and a carrier according to some embodiments. FIGS. 5J and 5K are cross sectional views illustrating modified examples of FIG. 5H.

Figure 5A:
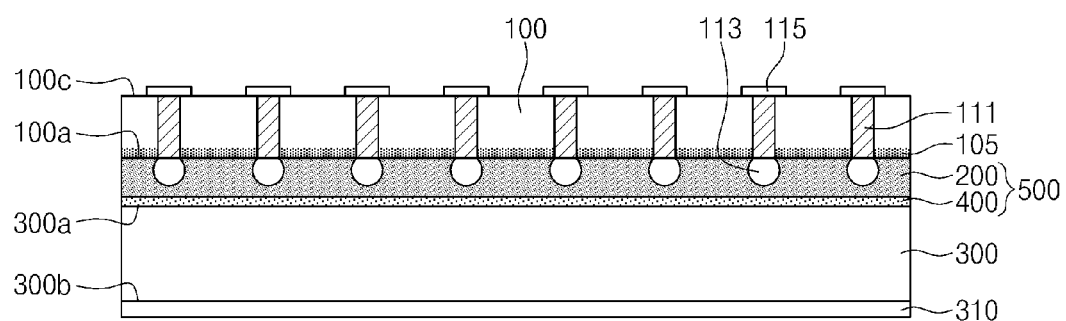
FIGS. 5A through 5I are cross sectional views illustrating another example of methods of fabricating a semiconductor package using a temporary bonding process of a wafer and a carrier according to example embodiments.

Referring to FIG. 5A, the wafer 100 and the carrier 300 may be bonded to each other with the middle layer 500 therebetween through processes that are the same as or similar to the processes described with reference to FIGS. 2A through 2C. The wafer 100 may then be thinned by, for example, a back side treatment.

Figure 5B:
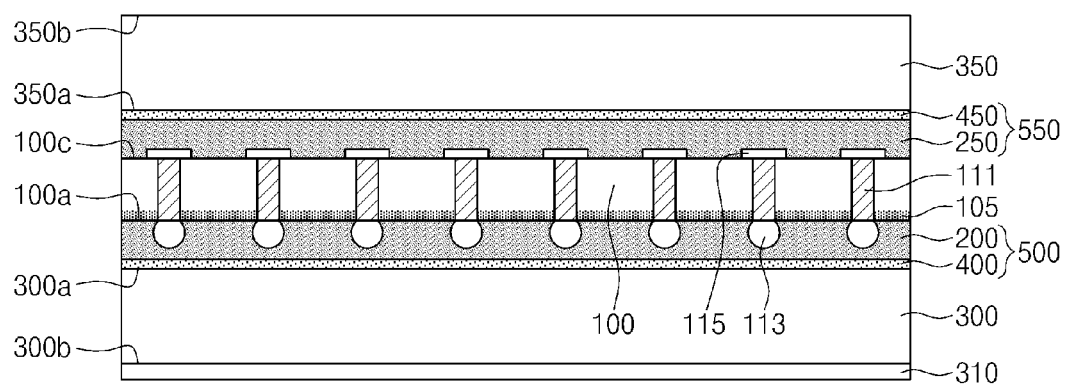

Referring to FIG. 5B, a second carrier 350 may be bonded to the non-active surface 100c of the wafer 100 with a second middle layer 550 therebetween. The second middle layer 550 may include a second adhesion layer 250 adjacent to the wafer 100, and a second release layer 450 adjacent to the second carrier 350 in an order similar to the middle layer 500. The second carrier 350 may be the same as or similar to the carrier 300, the second adhesion layer 250 may be the same as or similar to the adhesion layer 200, and the second release layer 450 may be the same as or similar to the release layer 400. For example, the second carrier 350 may be formed of the same material as the first carrier 400. In some embodiments, the second carrier 350 may include a transparent or non-transparent substrate (e.g. a glass substrate) having a top surface 350a and a bottom surface 350b. The second carrier 350 may be bonded to the wafer 100 in the state that the top surface 350a faces the non-active surface 100c of the wafer 100. The second adhesion layer 250 may include the thermosetting adhesive or the ultraviolet (UV) curable adhesive. The second adhesion layer 250 may be formed on the non-active surface 100c of the wafer 100 by a spin coating process or a spray coating process. The second release layer 450 may include silicon oil and/or polyethylene.

Figure 5C:
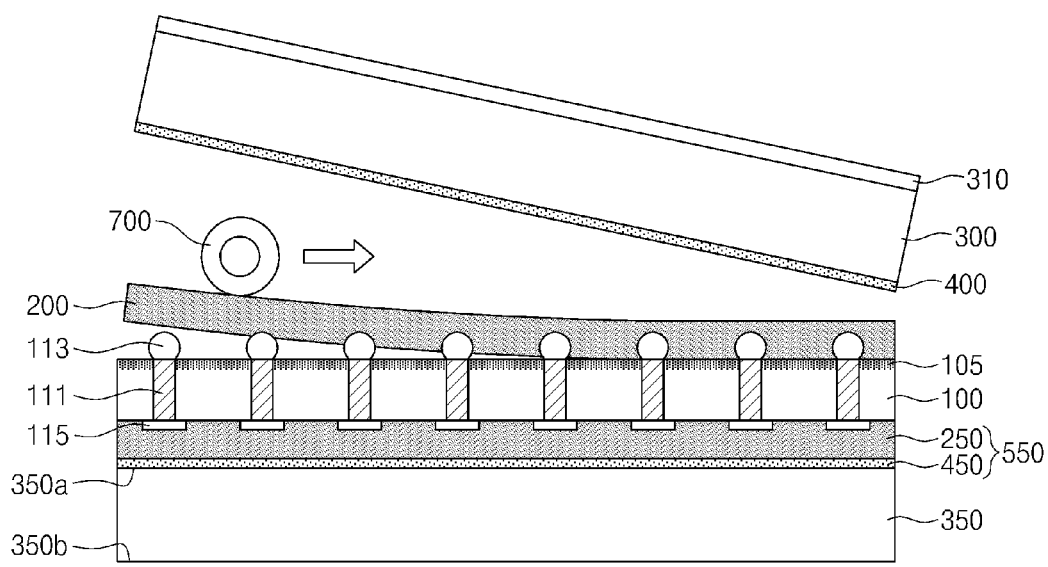

Referring to FIG. 5C, the carrier 300 and the adhesion layer 200 may be removed from the wafer 100. The carrier 300 and the adhesion layer 200 may be removed by processes that are the same as or similar to the processes described with reference to FIGS. 2D through 2F. For example, the carrier 300 may be removed from the wafer 100 by using the apparatus capable of holding the edge portion of the carrier 300, any remaining portion of the release layer 400 on the adhesion layer 200 may be removed using plasma or chemical processes, and the adhesion layer 200 may be stripped from the wafer 100 by using the rolling tape 700.

Figure 5D:
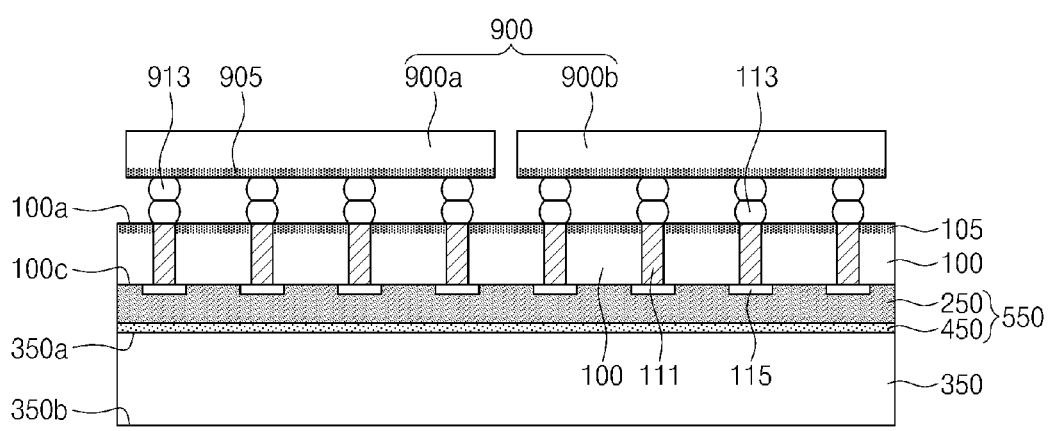

Referring to FIG. 5D, a plurality of chips 900 (e.g. chips 900a, 900b) may be stacked on the active surface 100a of the wafer 100. The chips 900 may be stacked on the active surface 100a of the wafer 100 in the face down state, and may be electrically connected to the wafer 100 through connection terminals 913 being connected to the through electrodes 111. Each of the chips 900 may include an integrated circuit 905 of the same kind as or a different kind from the integrated circuit 105 formed on the wafer 100. In other embodiments, as described with reference, for example, to FIG. 4C, after the second wafer 901 is stacked on the active surface 110a of the wafer 100, the second wafer 901 may be divided to form a plurality of chips 900.

Figure 5E:
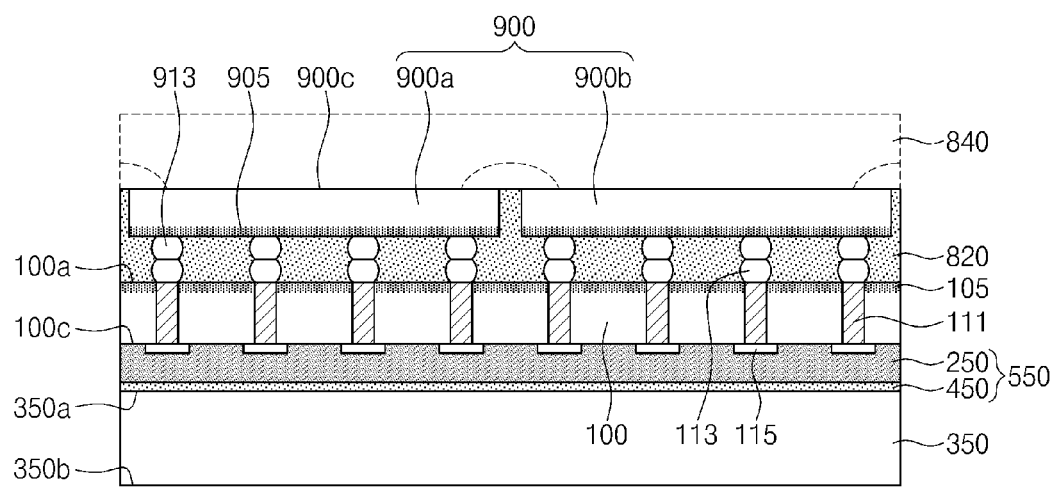

Referring to FIG. 5E, the under-fill layer 820 and/or the mold layer 840 may be formed and then planarized through processes that are the same as or similar to the processes described with reference to FIGS. 4D and 4E. Portions of the under-fill layer 820 protruding on the non-active surfaces 900c of the chips 900 and the mold layer 840 together may be removed during the planarization process. The under-fill layer 820 may surround sidewalls of the chips 900 and the non-active surface 900c of the chips 900 may be exposed.

Figure 5F:
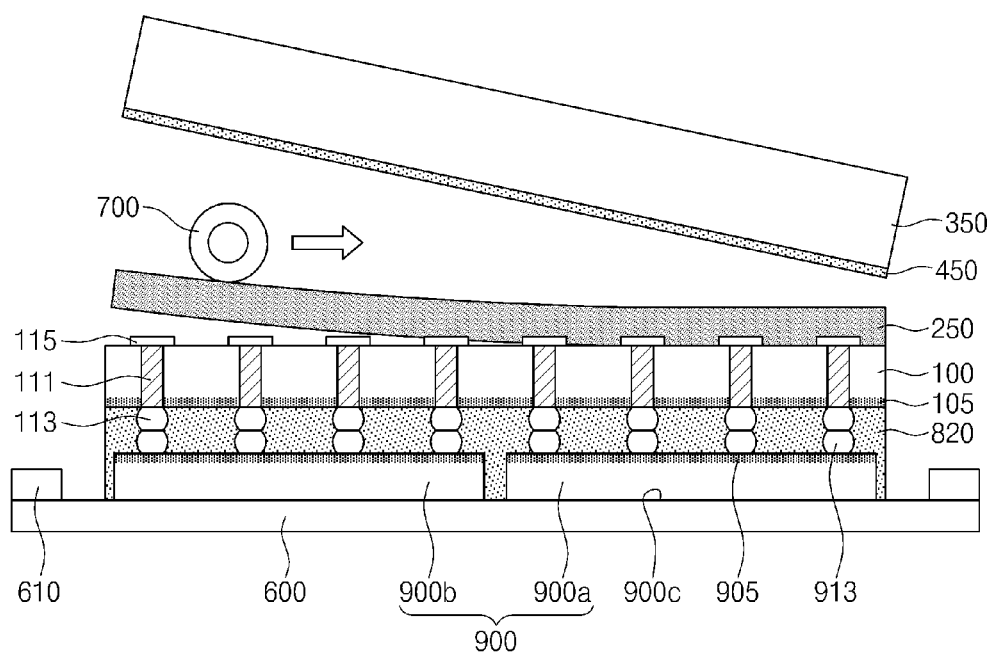

Referring to FIG. 5F, the second carrier 350 and the second adhesion layer 250 may be removed from the wafer 100. The second carrier 350 and the second adhesion layer 250 may be removed by processes that are the same as or similar to the processes described with reference to FIGS. 2D through 2F. For example, the protection layer 600 may be attached on the non-active surfaces 900c of the chips 900 and the wafer 100 may be stably fixed by the holder 610. The second carrier 350 may be removed from the wafer 100 by using an apparatus capable of holding an edge portion of the second carrier 350. The second adhesion layer 250 may be adhered to the rolling tape 700 and horizontally moved along an outer surface of the second adhesion layer 250 to remove it from the wafer 100. After the second carrier 350 is removed, any portion of the second release layer 450 remaining on the second adhesion layer 250 may be removed by a chemical or plasma treatment as discussed above.

Figure 5G:
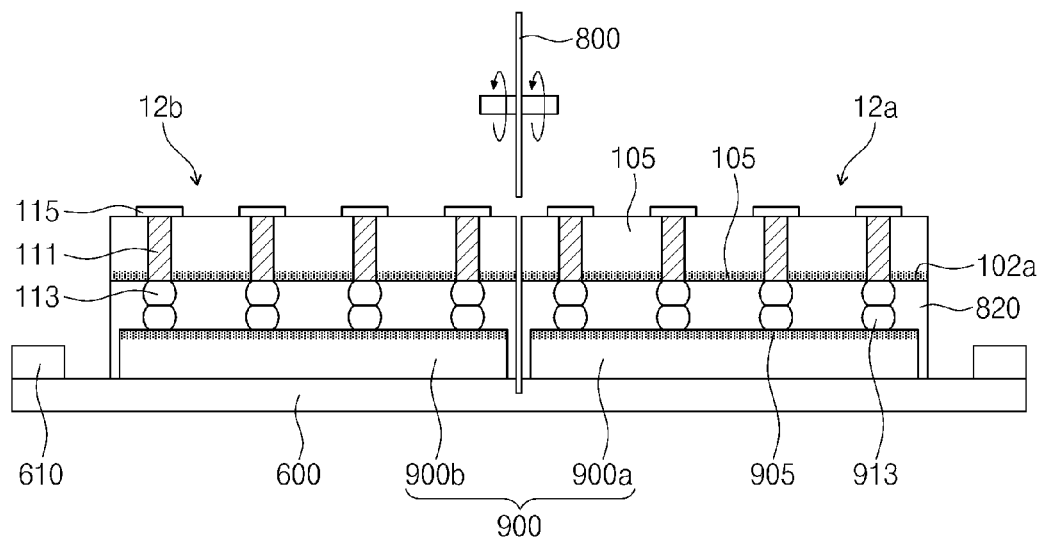

Referring to FIG. 5G, the under-fill layer 820 and the wafer 100 may be divided using the cutting wheel 800. Thus, a plurality of chip stacks 12 (e.g. stacks 12a, 12b) may be obtained. Each of the chip stacks 12 may include the first chip 102 divided from the wafer 100, and the second chip 900 bonded to the active surface 102a of the first chip 102 by a flip-chip bonding technique. The second chip 900 may have a smaller size than the first chip 102 or may be a same size as the first chip 102. At least one chip stack (e.g. stack 12a or stack 12b) selected from the plurality of chip stacks 12 may be packaged.

Figure 5H:
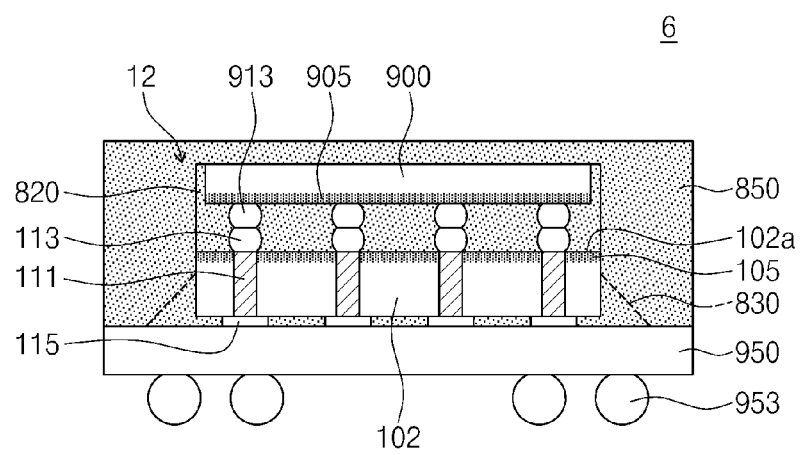

Referring to FIG. 5H, at least one chip stack 12 (e.g. chip stack 12a) may be mounted on a printed circuit board 950, and the mold layer 850 may be formed around the chip stack 12 to form a semiconductor package 6. The under-fill layer 820 may be disposed between the first and second chips 102, 900 and may surround a sidewall of the second chip 900. In some embodiments, before the mold layer 850 is formed, a second under-fill layer 830 may be formed that is disposed between the first chip 102 and the printed circuit board 950 d. In the semiconductor package 6, the first chip 102 may be mounted on the printed circuit board 950 in the face up state, and the second chip 900 may be stacked on the active surface 102a of the first chip 102 in the face down state.

Figure 5I:
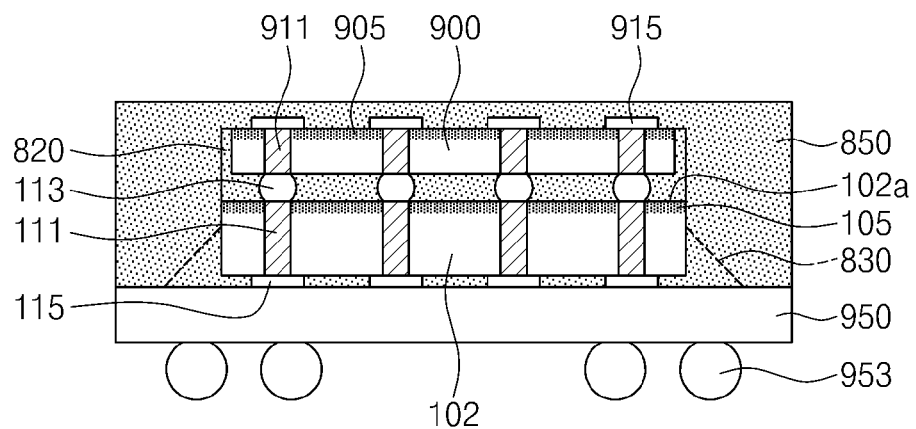
Figure 5J:
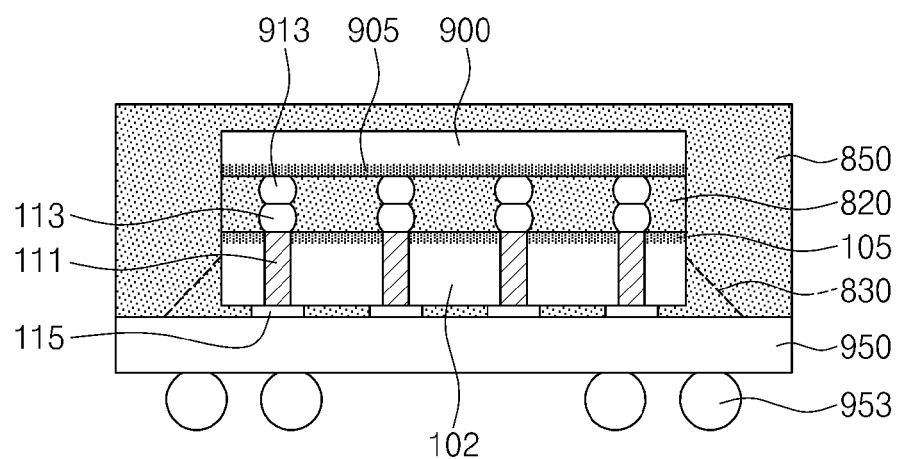
FIGS. 5J and 5K are cross sectional views illustrating modified examples of FIG. 5H.
Figure 5K:
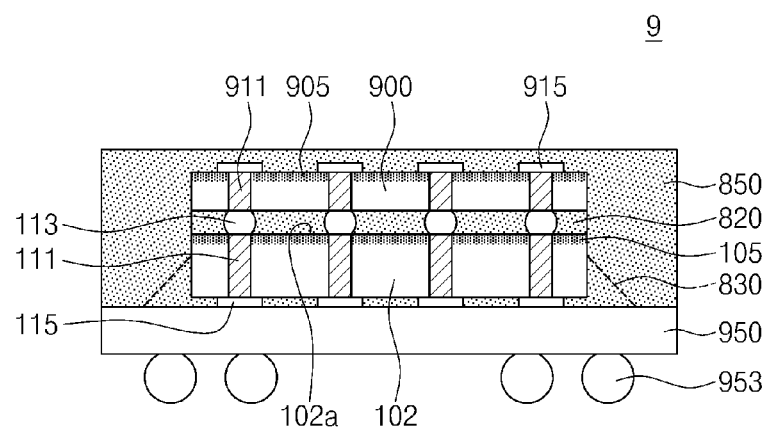

Referring to FIG. 5I, according to a modified embodiment of FIG. 5H, the second chip 900, further including through electrodes 911, may be stacked on the active surface 102a of the first chip 102 in the face up state, thereby forming a semiconductor package 7. For example, in FIG. 5D, the second chips 900, each including the through electrodes 911, may be stacked on the active surface 100a of the wafer 100 in the face up state, or the second wafer 901 including the through electrodes 911 may be stacked on the active surface 100a of the wafer 100 in the face up state. Accordingly, the semiconductor package 7 may be formed.

Referring to FIG. 5J, unlike FIG. 5G, if a size of the first chip 102 is the same as or similar to that of the second chip 900, the under-fill layer 820 may be confinedly disposed between the first chip 102 and the second chip 900 in a semiconductor package 8.

Referring to FIG. 5K, according to a modified embodiment of FIG. 5J, the second chip 900, further including through electrodes 911, may be stacked on the active surface 102a of the first chip 102 in the face up state, thereby forming a semiconductor package 9.

[Third Embodiment of Method of Fabricating Semiconductor Package]

FIGS. 6A through 6E are cross sectional views illustrating still another example of methods of fabricating a semiconductor package using a temporary bonding process of a wafer and a carrier according to some embodiments.

Figure 6A:
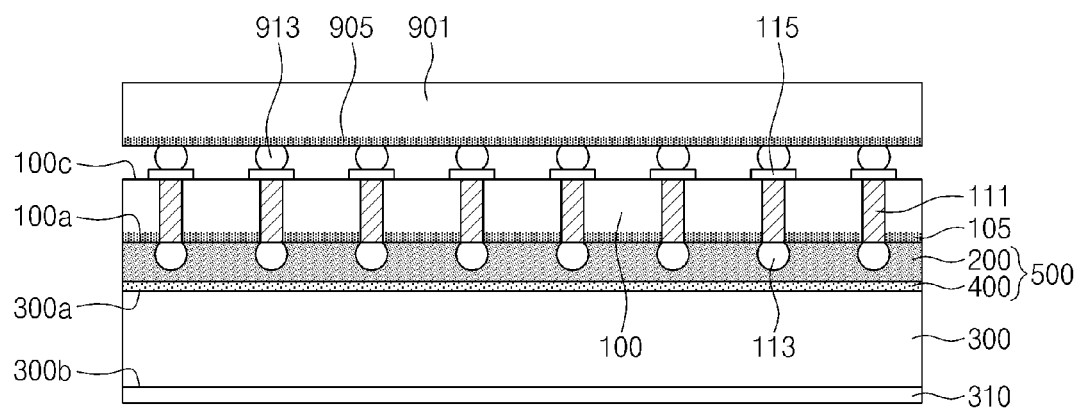
FIGS. 6A through 6E are cross sectional views illustrating still another example of methods of fabricating a semiconductor package using a temporary bonding process of a wafer and a carrier according to example embodiments.

Referring to FIG. 6A, the wafer 100 and the carrier 300 may be bonded to each other with the middle layer 500 therebetween through processes that are the same as or similar to the processes described with reference to FIGS. 2A through 2C. The wafer 100 may then be thinned by, for example, the back side treatment. Next, the second wafer 901 may be stacked on the non-active surface 100c of the wafer 100. The second wafer 901 may include an integrated circuit 905 of the same kind as or a different kind from the integrated circuit 105 of the wafer 100. The second wafer 901 may be stacked on the non-active surface 100c of the wafer 100 in the face down state to be electrically connected to the through electrodes 111 through the connections terminals 913, which may be solder balls or the like. In other embodiments, the second wafer 901 may be stacked on the non-active surface 100c of the wafer 100 in the face up state.

Figure 6B:
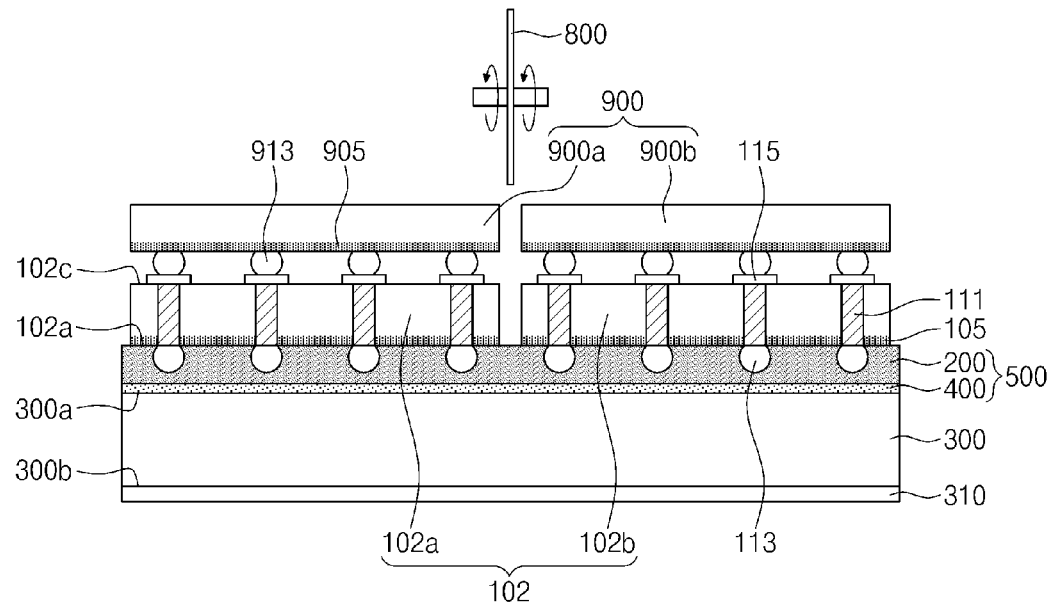

Referring to FIG. 6B, the wafer 100 and the second wafer 901 may be divided simultaneously by the cutting wheel 800. The wafer 100 may be divided to form a plurality of first chips 102 (e.g. chips 102a, 102b), and the second wafer 901 may be divided to form a plurality of second chips 900 (e.g. chips 900a, 900b). Each of the first chips 102 may include the active surface 102a and the non-active surface 102c. Each of the second chips 900 may be stacked on the non-active surfaces 102c of the first chips 102 in the face down state, respectively. Each of the first chips 102 may have the same size as or a size similar to a size of each of the second chips 900.

Figure 6C:
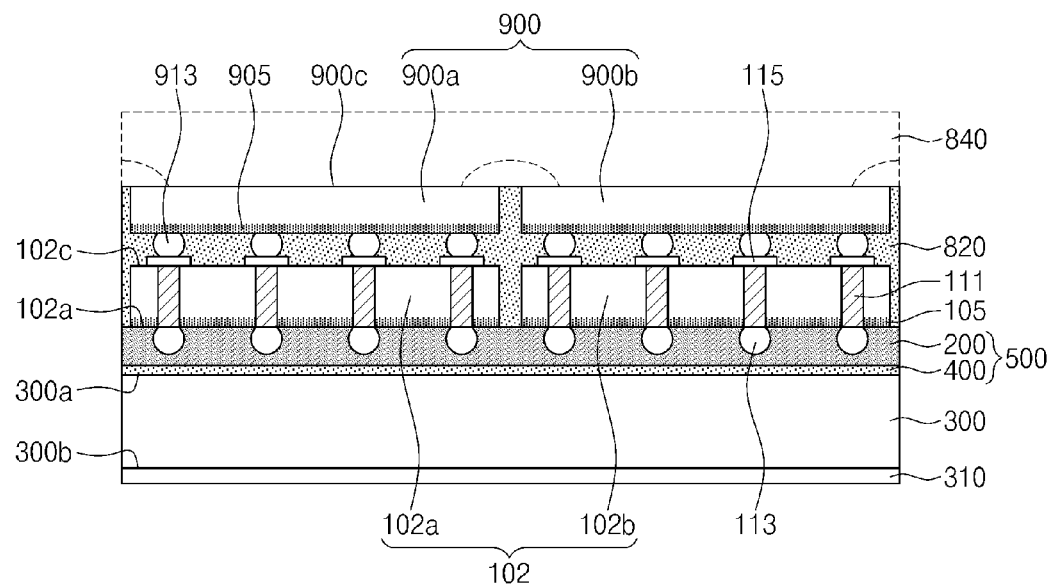

Referring to FIG. 6C, by processes that are the same as or similar to the processes described with reference to FIGS. 4D and 4E, after the under-fill layer 820 and/or the mold layer 840 are formed, the mold layer 840 and the under-fill layer 840 protruding on the non-active surfaces 900c of the second chips 900 may be removed. A planarized under-fill layer 820 may expose the non-active surfaces 900c of the second chips 900.

Figure 6D:
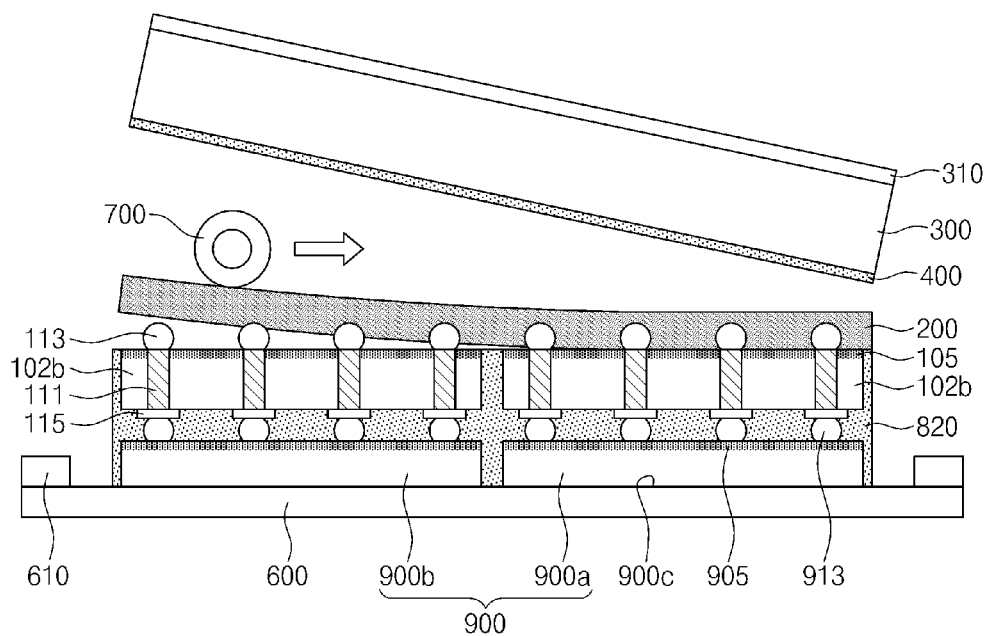

Referring to FIG. 6D, the carrier 300 and the adhesion layer 200 may be removed. The carrier 300 and the adhesion layer 200 may be removed by processes that are the same as or similar to the processes described with reference to FIGS. 2D through 2F. For example, the protection layer 600 may be bonded to the non-active surfaces 900c of the second chips 900, and the second chips 900 may be fixed by the holder 610. The carrier 300 may be removed by using the apparatus capable of holding the edge portion of the carrier 300, and the adhesion layer 200 may be adhered to the rolling tape 700, so that the adhesion layer 200 may removed from the first chips 102.

Figure 6E:
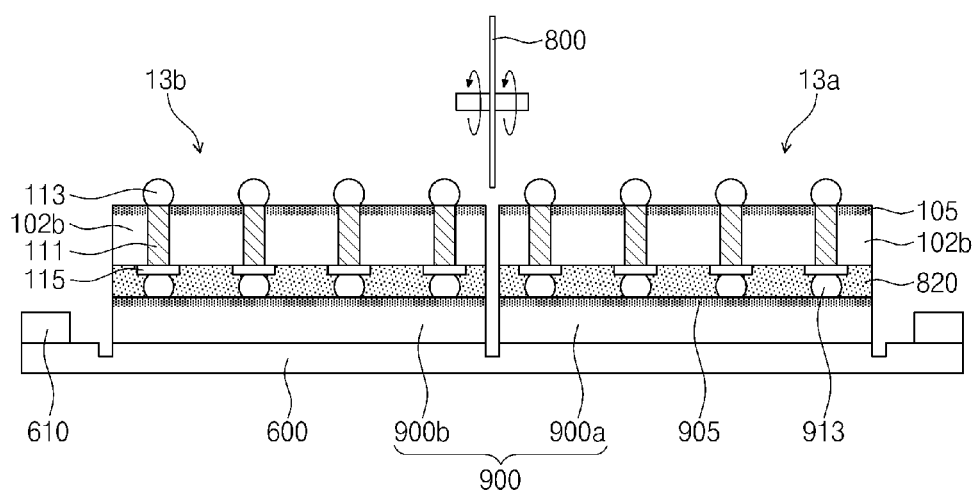

Referring to FIG. 6E, a plurality of chip stacks 13 (e.g. stacks 13a, 13b) may be formed by a sawing process using the cutting wheel 800. At least one chip stack 13 (e.g. stack 13a) may be packaged to form the semiconductor package 4 illustrated in FIG. 4K. Alternatively, when the second chips 900 include through electrodes 911, the semiconductor package 5 illustrated in FIG. 4L may be formed.

[Application]

Figure 7A:
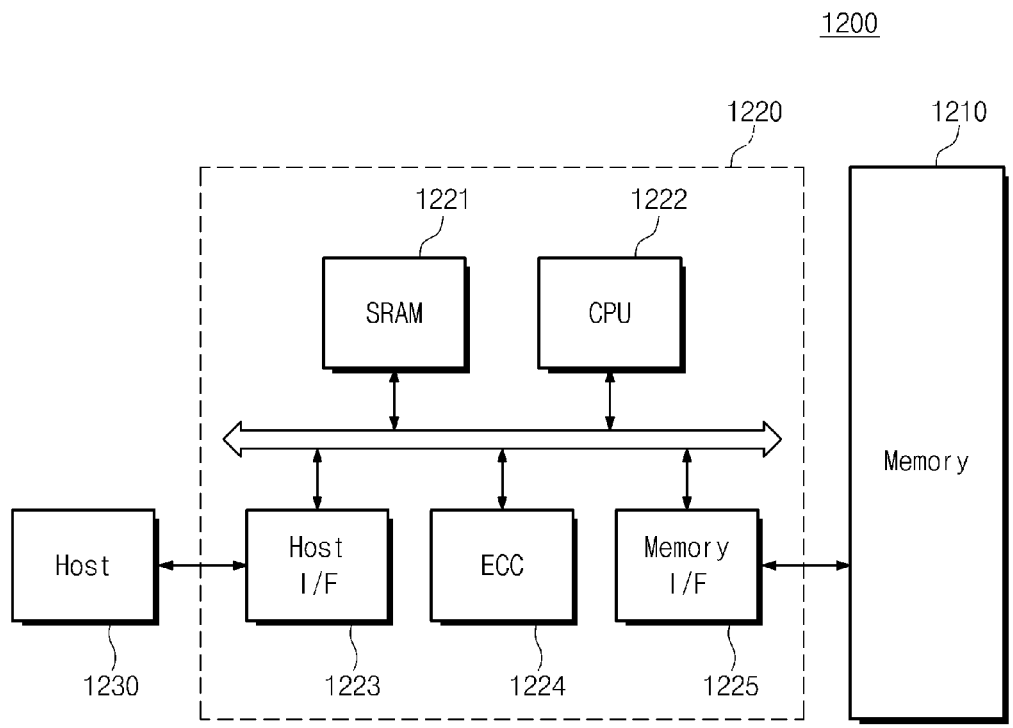
FIG. 7A is a schematic block diagram illustrating a memory card including a semiconductor package according to example embodiments.
Figure 7B:
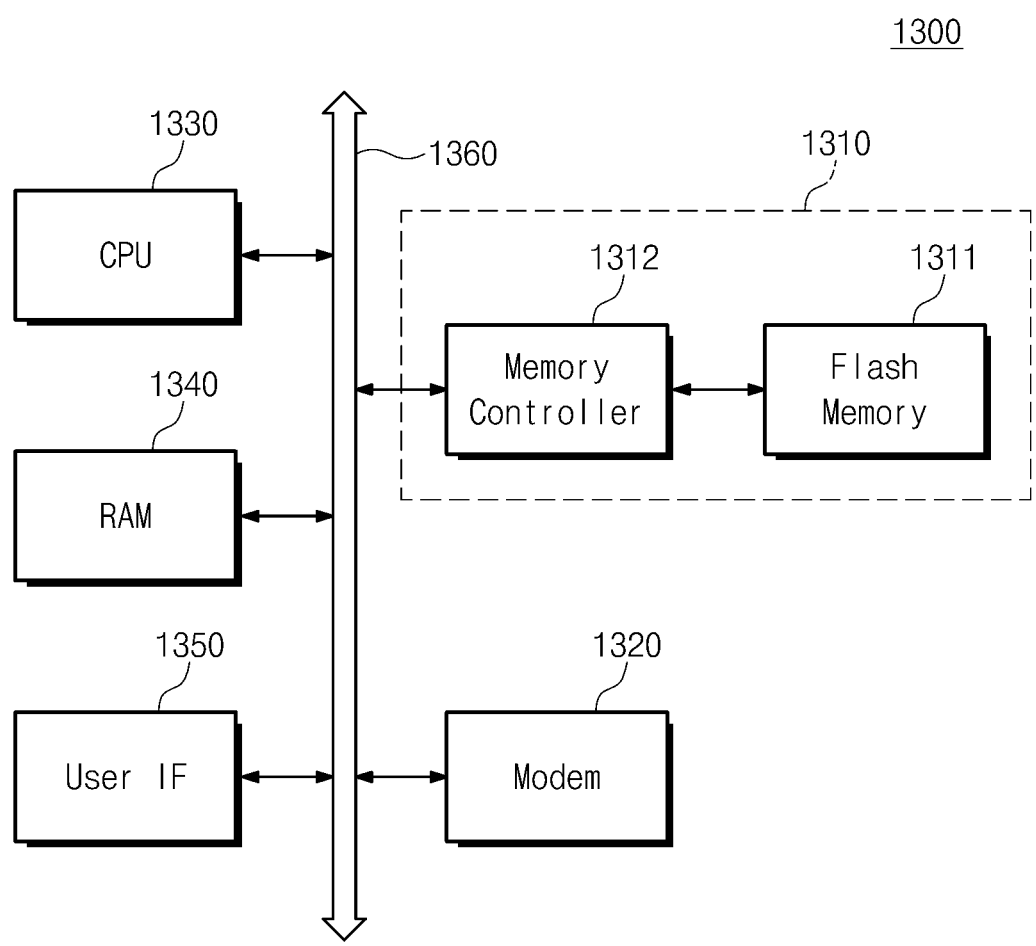
FIG. 7B is a schematic block diagram illustrating an information processing system including a semiconductor package according to example embodiments.

FIG. 7A is a schematic block diagram illustrating a memory card including a semiconductor package according to some embodiments. FIG. 7B is a schematic block diagram illustrating an information processing system including a semiconductor package according to some embodiments.

Referring to FIG. 7A, a semiconductor memory 1210 including at least one of the semiconductor packages 1 to 9 according to the embodiments described above may be applied to a memory card 1200. In an embodiment, the memory card 1200 may include a memory controller 1220 that controls data communication between a host 1230 and the semiconductor memory 1210. A SRAM device 1221 may be used as an operation memory of a central processing unit (CPU) 1222. A host interface unit 1223 may be configured to include a data communication protocol of the host 1230 connected to the memory card 1200. An error check and correction (ECC) block 1224 may detect and correct errors of data that are read out from the semiconductor memory 1210. A memory interface unit 1225 may be interfaced with the semiconductor memory 1210. The central processing unit (CPU) 1222 may control overall operations of the memory controller 1220. The methods and embodiments disclosed above may also be used to fabricate other parts of the memory card, such as, for example, the SRAM device 1221 and/or the CPU 1222.

Referring to FIG. 7B, an information processing system 1300 may include a memory system 1310 having at least one of the semiconductor packages 1 to 9 according to some embodiments. The information processing system 1300 may include a mobile system, a computer or the like. In an embodiment, the information processing system 1300 may include the memory system 1310, a modulator-demodulator (MODEM) 1320, a central processing unit (CPU) 1330, a random access memory (RAM) device 1340 and a user interface unit 1350 that communicate with each other through a data bus 1360. The memory system 1310 may include a memory 1311 and a memory controller 1312. The memory system 1310 may have substantially the same configuration as the memory card 1200 of FIG. 7A. The memory system 1310 may store data processed by the CPU 1330 or data transmitted from an external system. The information processing system 1300 may be applied to a memory card, a solid state disk, a camera image sensor or an application chipset. The methods and embodiments disclosed above may also be used to fabricate other parts of the memory card, such as, for example, the RAM device 1340 and/or the CPU 1330.

According to some embodiments, because irradiation of UV or laser is not required, the wafer may not be damaged and a high cost and/or complex process apparatus may not be needed or required. Thus, cost reduction, high productivity and/or improved yield may be effected.

The above-disclosed subject matter is to be considered illustrative and not restrictive, and the appended claims are intended to cover all such modifications, enhancements, and other embodiments, which fall within the true spirit and scope of the disclosed embodiments. Thus, the invention is to be construed by the broadest permissible interpretation of the following claims and their equivalents, and shall not be restricted or limited by the foregoing detailed description.

What is claimed is:

1. A method of manufacturing at least a first semiconductor chip, comprising:
   providing a middle layer between a substrate and a carrier to combine the carrier with the substrate;
   thinning the substrate; and
   after thinning the substrate, separating the carrier from the substrate;
   after the carrier is separated from the substrate, cutting the substrate to form at least the first semiconductor chip,
   wherein the middle layer is adhered to the carrier with a first bonding force, and the middle layer is adhered to the substrate with a second bonding force,
   wherein the second bonding force is greater than the first bonding force,
   wherein the middle layer includes an adhesion layer in contact with a release layer, the adhesion layer being in contact with the substrate and the release layer being in contact with the carrier,
   wherein the first bonding force is between the release layer and the adhesion layer, in the second bonding force is between the adhesion layer and the substrate,
   wherein the substrate includes a first ,surface on which an integrated circuit is formed, and a second surface opposite to the first surface, and
   wherein the middle layer is provided between the first the substrate and a first surface of the carrier that faces the first surface of the substrate, and the adhesion layer is adhered to the first surface of the substrate, and
   further comprising, before separating the carrier from the substrate:
   providing a second carrier on the second surface of the substrate, with a second middle layer therebetween to adhere the second carrier with the substrate,
   wherein the second middle layer is adhered to the second carrier with a third bonding force, and the second middle layer is adhered to the substrate with a fourth bonding force,
   wheren the fourth bonding force is greater than the third bonding force,
   wherein the second middle layer includes a second adhesion layer contacting the second surface of the substrate, and a second release layer contacting the adhesion layer and the second carrier, and wherein the third bonding force is between the second release layer and the second adhesion layer, and the fourth bonding force is between the second adhesion layer and the substrate.

2. The method of claim 1, wherein the release layer comprises one or more of silicon oil and polyethylene, and the carrier comprises glass.

3. The method of claim 1, wherein the adhesion layer includes at least one of a thermosetting adhesive or an ultraviolet (UV) curable adhesive.

4. The method of claim 1, wherein the second bonding force is at least 50% greater than the first bonding force.

5. The method of claim 1, wherein separating the carrier from the substrate comprises:
  mechanically separating the carrier from the adhesion layer; and
  after separating the carrier from the adhesion layer, separating the adhesion layer from the substrate.

6. A method of manufacturing at least a first semiconductor chip, comprising:
  providing a middle layer between a substrate and a carrier to combine the carrier with the substrate;
  thinning the substrate;
  after thinning the substrate, separating the carrier from the substrate; and
  after the carrier is separated from the substrate, cutting the substrate to form at least the first semiconductor chip,
  wherein the middle layer is adhered to the carrier with a first bonding force, and the middle layer is adhered to the substrate with a second bonding force, and
  wherein the second bonding force is greater than the first bonding force,
  wherein the middle layer includes an adhesion layer in contact with a release layer, the adhesion layer being in contact with the substrate and the release layer being in contact with the carrier, and
  wherein the first bonding force is between the release layer and the adhesion layer, and the second bonding force is between the adhesion layer and the substrate,
  wherein separating the carrier from the substrate comprises:
  mechanically separating the carrier from the adhesion layer; and
  after separating the carrier from the adhesion layer, separating the adhesion layer from the substrate, and
  wherein the step of mechanically separating the carrier from the adhesion layer does not include exposing the carrier and substrate to laser or ultraviolet radiation.

7. The method of claim 1, wherein the second release layer comprises one or more of silicon oil and polyethylene, and the second carrier comprises glass.

8. The method of claim 1, further comprising, after adhering the second carrier to the substrate:
  removing the carrier and the middle layer combined with the first surface of the substrate;
  dividing the substrate to form at least a second semiconductor chip;
  mechanically separating the second carrier from the second adhesion layer of the second middle layer;
  cleaning the second adhesion layer to remove any portion of the second release layer remaining on the second adhesion layer; and
  removing the second adhesion layer from the substrate.

* * * * *